(12) United States Patent
Priewasser et al.

(10) Patent No.: US 11,133,219 B2
(45) Date of Patent: Sep. 28, 2021

(54) METHOD OF PROCESSING A WAFER

(71) Applicant: DISCO Corporation, Tokyo (JP)

(72) Inventors: Karl Heinz Priewasser, Munich (DE);
Hitoshi Hoshino, Munich (DE);
Dietmar Mayer, Munich (DE)

(73) Assignee: DISCO CORPORATION, Tokyo (JP)

( * ) Notice: Subject to any disclaimer, the term of this patent is extended or adjusted under 35 U.S.C. 154(b) by 16 days.

(21) Appl. No.: 16/247,895

(22) Filed: Jan. 15, 2019

(65) Prior Publication Data
US 2019/0221480 A1  Jul. 18, 2019

(30) Foreign Application Priority Data

Jan. 16, 2018 (DE) ..................... 10 2018 200 656.3

(51) Int. Cl.
*H01L 21/78* (2006.01)
*H01L 21/02* (2006.01)
*H01L 21/683* (2006.01)

(52) U.S. Cl.
CPC ........ *H01L 21/78* (2013.01); *H01L 21/02013* (2013.01); *H01L 21/02016* (2013.01); *H01L 21/6836* (2013.01); *H01L 2221/6834* (2013.01); *H01L 2221/68327* (2013.01); *H01L 2221/68336* (2013.01)

(58) Field of Classification Search
None
See application file for complete search history.

(56) References Cited

U.S. PATENT DOCUMENTS

| | | | |
|---|---|---|---|
| 7,468,309 B2 | 12/2008 | Shigematsu et al. | |
| 8,969,177 B2 | 3/2015 | Chowdhury et al. | |
| 9,130,057 B1* | 9/2015 | Kumar | B26D 9/00 |
| 9,601,375 B2 | 3/2017 | Lei et al. | |
| 2004/0147120 A1 | 7/2004 | Rogalli et al. | |
| 2006/0102987 A1* | 5/2006 | Saiki | H01L 21/67282 |
| | | | 257/632 |
| 2010/0051190 A1 | 3/2010 | Jerebic et al. | |
| 2011/0146567 A1 | 6/2011 | Kroeninger et al. | |

(Continued)

FOREIGN PATENT DOCUMENTS

| | | |
|---|---|---|
| JP | 2007165636 A | 6/2007 |
| JP | 2008078430 A | 4/2008 |

(Continued)

*Primary Examiner* — Jay C Chang
(74) *Attorney, Agent, or Firm* — Greer Burns & Crain Ltd.

(57) ABSTRACT

The invention relates to methods of processing a wafer, having on one side a device area with a plurality of devices. In particular, the invention relates to a method which comprises providing a protective film, and applying the protective film to the side of the wafer being opposite to the one side, so that at least a central area of a front surface of the protective film is in direct contact with the side of the wafer being opposite to the one side. The method further comprises applying an external stimulus to the protective film during and/or after applying the protective film to the side of the wafer being opposite to the one side, so that the protective film is attached to the side of the wafer being opposite to the one side, and processing the one side of the wafer and/or the side of the wafer being opposite to the one side.

10 Claims, 9 Drawing Sheets

(56) References Cited

U.S. PATENT DOCUMENTS

| | | | | |
|---|---|---|---|---|
| 2014/0210075 A1* | 7/2014 | Lee | ......................... | B32B 38/04 |
| | | | | 257/737 |
| 2014/0315372 A1 | 10/2014 | Nakamura | | |
| 2015/0136312 A1* | 5/2015 | Wei | .................... | H01L 21/6836 |
| | | | | 156/248 |
| 2015/0228526 A1 | 8/2015 | Saeki et al. | | |
| 2017/0117166 A1* | 4/2017 | Ragunathan | ...... | H01L 21/67069 |

FOREIGN PATENT DOCUMENTS

| | | | |
|---|---|---|---|
| JP | 2016012585 A | 1/2016 | |
| TW | 201040241 A | 11/2010 | |
| TW | I450825 B | 9/2014 | |
| TW | I530996 B | 4/2016 | |
| TW | I592458 B | 1/2017 | |
| TW | 201729322 A | 8/2017 | |
| WO | 2017036512 A1 | 3/2017 | |
| WO | 2017188218 A1 | 11/2017 | |
| WO | 2018002035 A2 | 1/2018 | |

* cited by examiner

METHOD OF PROCESSING A WAFER

TECHNICAL FIELD

The present invention relates to methods of processing a wafer, such as a semiconductor wafer, having on one side a device area with a plurality of devices.

TECHNICAL BACKGROUND

In a semiconductor device fabrication process, a wafer having a device area with a plurality of devices, commonly partitioned by a plurality of division lines, is divided into individual dies. This fabrication process generally comprises a grinding step for adjusting the wafer thickness and a cutting step of cutting the wafer along the division lines to obtain the individual dies. The grinding step is performed from a back side of the wafer which is opposite to a wafer front side on which the device area is formed. Moreover, also other processing steps, such as polishing and/or etching, may be carried out on the back side of the wafer. The wafer may be cut along the division lines from its front side or its back side.

In order to protect the devices formed on the wafer, e.g., from breakage, deformation and/or contamination by debris, grinding water or cutting water, during processing of the wafer, a protective film or sheeting may be applied to the front side of the wafer prior to processing.

Such protection of the devices is particularly important if the device area has an uneven surface structure. For example, in known semiconductor device fabrication processes, such as Wafer Level Chip Scale Package (WLCSP), the device area of the wafer is formed with a plurality of protrusions, such as bumps, protruding from a plane surface of the wafer. These protrusions are used, for example, for establishing an electrical contact with the devices in the individual dies, e.g., when incorporating the dies in electronic equipment, such as mobile phones and personal computers.

In order to achieve a size reduction of such electronic equipment, the semiconductor devices have to be reduced in size. Hence, wafers having the devices formed thereon are ground in the grinding step referred to above to thicknesses in the $\mu$m range, e.g., in the range from 20 to 100 $\mu$m.

In known semiconductor device fabrication processes, problems may arise during processing, e.g., in the grinding step, if protrusions, such as bumps, are present in the device area. In particular, due to the presence of these protrusions, the risk of breakage of the wafer during processing is significantly increased. Further, if the wafer is ground to a small thickness, e.g., a thickness in the $\mu$m range, the protrusions of the device area on the front side of the wafer may cause a deformation of the wafer back side, thus compromising the quality of the resulting dies.

Therefore, the use of a protective film or sheeting is, of particular importance when processing wafers with device areas having such uneven surface structures.

However, in particular, for the case of sensitive devices, such as MEMS, there is a problem in that the device structure on the wafer may be damaged by the adhesive force of an adhesive layer formed on the protective film or sheeting or may be contaminated by adhesive residues on the devices, when the film or sheeting is peeled off from the wafer.

A protective film or sheeting may be applied to the back side of the wafer prior to processing, in order to protect the wafer, e.g., from breakage, deformation and/or contamination by debris, for example, during a step of cutting the wafer.

Also in this case, there is a problem that the wafer may be damaged by the adhesive force of an adhesive layer formed on the protective film or sheeting or may be contaminated by adhesive residues on the wafer, when the film or sheeting is peeled off from the wafer.

Hence, there remains a need for a reliable and efficient method of processing a wafer having a device area which allows for any risk of contamination and damage to the wafer to be minimised.

SUMMARY OF THE INVENTION

Accordingly, it is an object of the present invention to provide a reliable and efficient method of processing a wafer having a device area which allows for any risk of contamination and damage to the wafer to be minimised. This goal is achieved by a wafer processing method with the technical features of claim 1, by a wafer processing method with the technical features of claim 9 and by a wafer processing method with the technical features of claim 19. Preferred embodiments of the invention follow from the dependent claims.

The invention provides a method of processing a wafer having on one side a device area with a plurality of devices. The method comprises providing a protective film or sheet and applying the protective film or sheet to the side of the wafer being opposite to the one side, so that at least a central area of a front surface of the protective film or sheet is in direct contact with the side of the wafer being opposite to the one side. Further, the method comprises applying an external stimulus to the protective film or sheet during and/or after applying the protective film or sheet to the side of the wafer being opposite to the one side, so that the protective film or sheet is attached to the side of the wafer being opposite to the one side, and processing the one side of the wafer and/or the side of the wafer being opposite to the one side.

The protective film is applied to the side of the wafer being opposite to the one side, i.e., to the wafer back side, so that at least the central area of the front surface of the protective film is in direct contact with the side of the wafer being opposite to the one side. Thus, no material, in particular, no adhesive, is present between at least the central area of the front surface of the protective film and the side of the wafer being opposite to the one side.

Therefore, the risk of a possible contamination of or damage to the wafer, e.g., due to an adhesive force of an adhesive layer or adhesive residues on the wafer, can be significantly reduced or even eliminated.

During and/or after applying the protective film to the side of the wafer being opposite to the one side, the external stimulus is applied to the protective film, so that the protective film is attached to the side of the wafer being opposite to the one side. An attachment force between protective film and wafer, holding the protective film in its position on the wafer, is thus generated through the application of the external stimulus. Hence, no additional adhesive material is necessary for attaching the protective film to the side of the wafer being opposite to the one side.

In particular, by applying the external stimulus to the protective film, a form fit, such as a positive fit, and/or a material bond, such as an adhesive bond, may be formed between the protective film and the wafer. The terms "material bond" and "adhesive bond" define an attachment or connection between protective film and wafer due to atomic and/or molecular forces acting between these two components.

The term "adhesive bond" relates to the presence of these atomic and/or molecular forces, which act so as to attach or adhere the protective film to the wafer, and does not imply the presence of an additional adhesive between protective film and wafer. Rather, at least the central area of the front surface of the protective film is in direct contact with the side of the wafer being opposite to the one side, as has been detailed above.

The method of the present invention thus enables reliable and efficient processing of a wafer having a device area, minimising any risk of contamination and damage to the wafer.

The wafer back side surface may be a substantially flat, even surface or a flat, even surface. Alternatively, protrusions or projections protruding from a plane wafer surface along the thickness direction of the wafer may be present on the back side of the wafer.

Applying the external stimulus to the protective film may comprise or consist of heating the protective film and/or cooling the protective film and/or applying a vacuum to the protective film and/or irradiating the protective film with radiation, such as light, e.g., by using a laser beam.

The external stimulus may comprise or be a chemical compound and/or electron or plasma irradiation and/or mechanical treatment, such as pressure, friction or ultrasound application, and/or static electricity.

Particularly preferably, applying the external stimulus to the protective film comprises or consists of heating the protective film. For example, applying the external stimulus to the protective film may comprise or consist of heating the protective film and applying a vacuum to the protective film. In this case, the vacuum may be applied to the protective film during and/or before and/or after heating the protective film.

If applying the external stimulus to the protective film comprises or consists of heating the protective film, the method may further comprise allowing the protective film to cool down after the heating process. In particular, the protective film may be allowed to cool down to its initial temperature, i.e., to the temperature thereof prior to the heating process. The protective film may be allowed to cool down, e.g., to its initial temperature, before processing the one side of the wafer, i.e., the wafer front side, and/or the side of the wafer being opposite to the one side, i.e., the wafer back side.

An attachment force between protective film and wafer is generated through the heating process. The attachment of the protective film to the wafer may be caused in the heating process itself and/or in a subsequent process of allowing the protective film to cool down.

The protective film may be softened by the heating process, e.g., so as to conform to the wafer surface on the side of the wafer being opposite to the one side, for example, absorbing the wafer topography. Upon cooling down, e.g., to its initial temperature, the protective film may reharden, e.g., so as to create a form fit and/or a material bond to the wafer.

The protective film may be heat resistant up to a temperature of 180° C. or more, preferably up to a temperature of 220° C. or more, more preferably up to a temperature of 250° C. or more, and even more preferably up to a temperature of 300° C. or more.

The protective film may be heated to a temperature in the range of 30° C. to 250° C., preferably 50° C. to 200° C., more preferably 60° C. to 150° C. and even more preferably 70° C. to 110° C. Particularly preferably, the protective film is heated to a temperature of approximately 80° C.

The protective film may be heated over a duration in the range of 30 sec to 10 min, preferably 1 min to 8 min, more preferably 1 min to 6 min, even more preferably 1 min to 4 min and yet more preferably 1 min to 3 min, during and/or after applying the protective film to the side of the wafer being opposite to the one side.

If applying the external stimulus to the protective film comprises or consists of heating the protective film, the protective film may be directly and/or indirectly heated.

The protective film may be heated by directly applying heat thereto, e.g., using a heat application means, such as a heated roller, a heated stamp or the like, or a heat radiation means. The protective film and the wafer may be placed in a receptacle or chamber, such as a vacuum chamber, and an inner volume of the receptacle or chamber may be heated, so as to heat the protective film. The receptacle or chamber may be provided with a heat radiation means.

The protective film may be indirectly heated, e.g., by heating the wafer before and/or during and/or after applying the protective film to the side of the wafer being opposite to the one side. For example, the wafer may be heated by placing the wafer on a support or carrier, such as a chuck table, and heating the support or carrier.

For example, the support or carrier, such as a chuck table, may be heated to a temperature in the range of 30° C. to 250° C., preferably 50° C. to 200° C., more preferably 60° C. to 150° C. and even more preferably 70° C. to 110° C. Particularly preferably, the support or carrier may be heated to a temperature of approximately 80° C.

These approaches may also be combined, for example, by using a heat application means, such as a heated roller or the like, or a heat radiation means for directly heating the protective film, and also indirectly heating the protective film through the wafer.

If applying the external stimulus to the protective film comprises or consists of heating the protective film, it is preferable that the protective film is pliable, elastic, flexible, stretchable, soft and/or compressible when in its heated state. In this way, it can be particularly reliably ensured that the protective film conforms to the wafer surface on the side of the wafer being opposite to the one side, for example, absorbing the wafer topography. This is especially advantageous if protrusions, such as surface unevenness or roughness, bumps, optical elements or the like, protruding along a thickness direction of the wafer are present on the wafer back side, as will be further detailed below.

Preferably, the protective film, at least to some degree, hardens or stiffens upon cooling down, so as to become more rigid and/or robust in the cooled down state. In this way, particularly reliable protection of the wafer during subsequent processing of the wafer, such as cutting the wafer, can be ensured.

The method may further comprise, during and/or after applying the protective film to the side of the wafer being opposite to the one side, applying pressure to a back surface of the protective film opposite to the front surface thereof. In this way, the front surface of the protective film is pressed against the side of the wafer being opposite to the one side. Thus, it can be particularly efficiently ensured that the protective film is reliably attached to the wafer.

If applying the external stimulus to the protective film comprises heating the protective film, the pressure may be applied to the back surface of the protective film before and/or during and/or after heating the protective film. The pressure may be applied to the back surface of the protective film before processing the front side and/or the back side of the wafer.

The pressure may be applied to the back surface of the protective film by a pressure application means, such as a roller, a stamp, a membrane or the like.

Particularly preferably, a combined heat and pressure application means, such as a heated roller or a heated stamp, may be used. In this case, pressure can be applied to the back surface of the protective film while, at the same time, heating the protective film.

The pressure may be applied to the back surface of the protective film in a vacuum chamber, as will be further detailed below.

The protective film may be applied and/or attached to the back side of the wafer in a reduced pressure atmosphere, in particular, under a vacuum. In this way, it can be reliably ensured that no voids and/or air bubbles are present between the protective film and the wafer. Hence, any stress or strain on the wafer during processing the front side and/or the back side thereof, e.g., due to such air bubbles expanding in the heating process, is avoided.

For example, the step or steps of applying and/or attaching the protective film to the side of the wafer being opposite to the one side may be carried out in a vacuum chamber. In particular, the protective film may be applied and/or attached to the side of the wafer being opposite to the one side by using a vacuum laminator. In such a vacuum laminator, the wafer is placed on a chuck table in a vacuum chamber in a state in which the wafer front side is in contact with an upper surface of the chuck table and the wafer back side is oriented upward. The chuck table may be, for example, a heated chuck table.

The protective film to be applied to the wafer back side is held at its peripheral portion by an annular frame and placed above the wafer back side in the vacuum chamber. An upper part of the vacuum chamber which is situated above the chuck table and the annular frame is provided with an air inlet port closed by an expandable rubber membrane.

After the wafer and the protective film have been loaded into the vacuum chamber, the chamber is evacuated and air is supplied through the air inlet port to the rubber membrane, causing the rubber membrane to expand into the evacuated chamber. In this way, the rubber membrane is moved downward in the vacuum chamber so as to push the protective film against the wafer back side, sealing the peripheral wafer portion with the protective film and pressing the film against the wafer back side. Hence, the protective film can be applied closely to the wafer back side, e.g., so as to follow the contours of protrusions or projections, if such protrusions or projections are present.

The protective film may be heated during and/or after application thereof to the side of the wafer being opposite to the one side, e.g., by heating the chuck table.

Subsequently, the vacuum in the vacuum chamber is released and the protective film is held in its position on the wafer back side by the attachment force generated through the heating process and the positive pressure in the vacuum chamber.

Alternatively, the rubber membrane can be replaced by a soft stamp or a soft roller, e.g., a heated soft stamp or a heated soft roller.

The method may further comprise removing the protective film from the wafer after processing the front side and/or the back side thereof. Before and/or during removal of the protective film from the wafer, an external stimulus, such as heat, may be applied to the protective film. In this way, the removal process can be facilitated.

The wafer may further have, on the front side thereof, a peripheral marginal area having no devices and being formed around the device area.

The wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the wafer may be, for example, a Si wafer, a GaAs wafer, a GaN wafer, a GaP wafer, an InAs wafer, an InP wafer, a SiC wafer, a SiN wafer, a LT (lithium tantalate) wafer, a LN (lithium niobate) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

The wafer may have any type of shape. In a top view thereon, the wafer may have, for example, a circular shape, an oval shape, an elliptical shape or a polygonal shape, such as a rectangular shape or a square shape.

The protective film may have any type of shape. In a top view thereon, the protective film or sheet may have, for example, a circular shape, an oval shape, an elliptical shape or a polygonal shape, such as a rectangular shape or a square shape.

The protective film may have substantially the same shape or the same shape as the wafer.

The protective film may have an outer diameter which is larger than an outer diameter of the wafer. In this way, processing, handling and/or transport of the wafer can be facilitated. In particular, an outer peripheral portion of the protective film can be attached to an annular frame, as will be detailed below.

The protective film may have an outer diameter which is smaller than the outer diameter of the wafer.

The protective film may have an outer diameter which is substantially the same as the outer diameter of the wafer.

The method may further comprise cutting the protective film. The protective film may be cut so that it has an outer diameter which is larger than the outer diameter of the wafer or smaller than the outer diameter of the wafer or substantially the same as the outer diameter of the wafer.

The step of cutting the protective film may be performed before or after applying the protective film to the wafer.

The step of cutting the protective film may be performed before or after attaching the protective film to the wafer.

The method may further comprise attaching an outer peripheral portion of the protective film to an annular frame. In particular, the outer peripheral portion of the protective film may be attached to the annular frame so that the protective film closes a central opening of the annular frame, i.e., the area inside the inner diameter of the annular frame. In this way, the wafer, which is attached to the protective film, in particular, to a central portion thereof, is held by the annular frame through the protective film. Thus, a wafer unit, comprising the wafer, the protective film and the annular frame, is formed, facilitating processing, handling and/or transport of the wafer.

The step of attaching the outer peripheral portion of the protective film to the annular frame may be performed before or after applying the protective film to the wafer.

The step of attaching the outer peripheral portion of the protective film to the annular frame may be performed before or after attaching the protective film to the wafer.

The step of attaching the outer peripheral portion of the protective film to the annular frame may be performed before or after processing the front side and/or the back side of the wafer.

At least one division line may be formed on the one side of the wafer. A plurality of division lines may be formed on the one side of the wafer. The one or more division lines partition the devices formed in the device area.

The width of the at least one division line may be in the range of 30 µm to 200 µm, preferably 30 µm to 150 µm and more preferably 30 µm to 100 µm.

The method may comprise processing the one side of the wafer, i.e., the wafer front side. Processing the one side of the wafer may comprise or consist of removing wafer material along the at least one division line. If a plurality of division lines is formed on the one side of the wafer, processing the one side of the wafer may comprise or consist of removing wafer material along each of the plurality of division lines.

The wafer material may be removed along the at least one division line throughout the entire thickness of the wafer. In this case, the wafer is divided along the at least one division line into a plurality of chips or dies by the wafer material removal process.

Alternatively, the wafer material may be removed along the at least one division line along only part of the thickness of the wafer. For example, the wafer material may be removed along 20% or more, 30% or more, 40% or more, 50% or more, 60% or more, 70% or more, 80% or more, or 90% or more of the thickness of the wafer.

In this case, a process of dividing, i.e., fully dividing, the wafer may be carried out, for example, by adopting a breaking process, applying an external force to the wafer, e.g., using an expansion tape, or by adopting a cutting or dicing process, such as a mechanical cutting or dicing process, a laser cutting or dicing process or a plasma cutting or dicing process. For example, an external force may be applied to the wafer by radially expanding the protective film, i.e., by using the protective film as an expansion tape. Further, also a combination of two or more of these processes may be employed.

Moreover, the wafer may be divided by grinding the side of the wafer being opposite to the one side, as will be further detailed below.

The wafer material may be mechanically removed along the at least one division line. In particular, the wafer material may be removed along the at least one division line by mechanically cutting the wafer along the at least one division line, e.g., by blade dicing or sawing. In this case, the wafer is cut from the front side thereof.

Alternatively or in addition, the wafer material may be removed along the at least one division line by laser cutting and/or by plasma cutting.

The wafer may be cut in a single mechanical cutting step, a single laser cutting step or a single plasma cutting step. Alternatively, the wafer may be cut by a sequence of mechanical cutting and/or laser cutting and/or plasma cutting steps.

Laser cutting may be performed, for example, by ablation laser cutting and/or by stealth laser cutting, i.e., by forming modified regions within the wafer by the application of a laser beam, as will be further detailed below, and/or by forming a plurality of hole regions in the wafer by the application of a laser beam. Each of these hole regions may be composed of a modified region and a space in the modified region open to a surface of the wafer.

By having the protective film attached to the wafer back side, it can be ensured that the pressure applied during the cutting step is more uniformly and homogeneously distributed throughout the wafer during cutting, thus reducing or even minimising any risk of damage to the wafer, e.g., cracking of the sidewalls of the resulting chips or dies, in the cutting step.

The method may comprise processing the one side of the wafer, wherein processing the one side of the wafer comprises or consists of applying a pulsed laser beam to the wafer from the one side of the wafer, the wafer is made of a material which is transparent to the pulsed laser beam, and the pulsed laser beam is applied to the wafer at least in a plurality of positions along the at least one division line, in a condition where a focal point of the pulsed laser beam is located at a distance from the one side of the wafer in the direction from the one side of the wafer towards the side of the wafer being opposite to the one side, so as to form a plurality of modified regions in the wafer along the at least one division line.

In this case, the wafer is made of a material which is transparent to the pulsed laser beam. Thus, the plurality of modified regions is formed in the wafer by the application of a pulsed laser beam having a wavelength that allows transmission of the laser beam through the wafer. For example, if the wafer is a Si wafer, the pulsed laser beam may have a wavelength of 1.0 µm or more.

The pulsed laser beam may have a pulse width, for example, in the range of 1 ns to 300 ns.

The modified regions may comprise amorphous regions or regions in which cracks are formed, or may be amorphous regions or regions in which cracks are formed. In particularly preferred embodiments, the modified regions comprise or are amorphous regions.

Each modified region may comprise a space, e.g., a cavity, inside the wafer material, the space being surrounded by an amorphous region or a region in which cracks are formed.

Each modified region may be composed of a space, e.g., a cavity, inside the wafer material and an amorphous region or a region in which cracks are formed surrounding the space.

If the modified regions comprise or are regions in which cracks are formed, i.e., cracks have been formed, the cracks may be microcracks. The cracks may have dimensions, e.g., lengths and/or widths, in the µm range. For example, the cracks may have widths in the range of 5 µm to 100 µm and/or lengths in the range of 100 µm to 1000 µm.

According to this method, the pulsed laser beam is applied to the wafer from the one side of the wafer at least in a plurality of positions along the at least one division line, so as to form a plurality of modified regions in the wafer along the at least one division line. By forming these modified regions, the strength of the wafer in the areas thereof where the modified regions are formed is reduced. Hence, division of the wafer along the at least one division line where the plurality of modified regions has been formed is greatly facilitated. In such a wafer division process, the individual devices provided in the device area of the wafer are obtained as chips or dies.

The method may further comprise, after forming the plurality of modified regions in the wafer, dividing the wafer along the at least one division line. The process of dividing the wafer may be carried out in various ways, e.g., by adopting a breaking process, applying an external force to the wafer, for example, using an expansion tape, or by adopting a cutting or dicing process, such as a mechanical cutting or dicing process, a laser cutting or dicing process or a plasma cutting or dicing process. For example, an external force may be applied to the wafer by radially expanding the protective film, i.e., by using the protective film as an expansion tape. Further, also a combination of two or more of these processes may be employed.

The method may comprise processing the side of the wafer being opposite to the one side. Processing the side of the wafer being opposite to the one side may comprise or consist of applying a pulsed laser beam to the wafer from the side of the wafer being opposite to the one side, wherein the protective film is made of a material which is transparent to the pulsed laser beam, the wafer is made of a material which is transparent to the pulsed laser beam, and the pulsed laser beam is applied to the wafer at least in a plurality of positions along the at least one division line, in a condition where a focal point of the pulsed laser beam is located at a distance from the side of the wafer being opposite to the one side in the direction from the side of the wafer being opposite to the one side towards the one side of the wafer, so as to form a plurality of modified regions in the wafer along the at least one division line.

The pulsed laser beam applied from the back side of the wafer may be the same pulsed laser beam as applied from the front side of the wafer or a different pulsed laser beam.

The modified regions formed by applying the pulsed laser beam from the back side of the wafer may be formed substantially in the same manner as the modified regions formed by applying the pulsed laser beam from the front side of the wafer.

The protective film may be applied to the side of the wafer being opposite to the one side so that, in the entire region where the front surface of the protective film is in contact with the side of the wafer being opposite to the one side, the front surface of the protective film is in direct contact with the side of the wafer being opposite to the one side. Thus, no material, in particular, no adhesive, is present between the front surface of the protective film and the side of the wafer being opposite to the one side.

In this way, the risk of a possible contamination of or damage to the wafer, e.g., due to an adhesive force of an adhesive layer or adhesive residues on the wafer, can be reliably eliminated.

Alternatively, the protective film may be provided with an adhesive layer, wherein the adhesive layer is provided only in a peripheral area of the front surface of the protective film, the peripheral area surrounding the central area of the front surface of the protective film, and the protective film is applied to the side of the wafer being opposite to the one side so that the adhesive layer comes into contact only with a peripheral portion of the side of the wafer being opposite to the one side. The peripheral portion of the side of the wafer being opposite to the one side may correspond to a peripheral marginal area formed on the one side of the wafer.

In this way, the attachment of the protective film to the wafer can be further improved. Since the adhesive layer is provided only in the peripheral area of the front surface of the protective film, the area in which protective film and wafer are attached to each other by the adhesive layer is significantly reduced as compared to a case where an adhesive layer is provided on the entire front surface of the protective film. Thus, the protective film can be detached from the wafer more easily and the risk of damage to the wafer, in particular, to protrusions formed on the back side thereof, is considerably reduced.

The adhesive of the adhesive layer may be curable by an external stimulus, such as heat, UV radiation, an electric field and/or a chemical agent. In this way, the protective film can be particularly easily removed from the wafer after processing. The external stimulus may be applied to the adhesive so as to lower the adhesive force thereof, thus allowing for an easy removal of the protective film.

For example, the adhesive layer may have a substantially annular shape, an open rectangular shape or an open square shape, i.e., a rectangular or square shape, respectively, with an opening in the centre of the adhesive layer.

The protective film may be expandable. The protective film may be expanded when being applied to the side of the wafer being opposite to the one side. If protrusions are present on the side of the wafer being opposite to the one side, the protective film may be expanded when being applied to the side of the wafer being opposite to the one side so as to closely or at least partly follow the contours of these protrusions.

In particular, the protective film may be expandable to twice its original size or more, preferably three times its original size or more and more preferably four times its original size or more. In this way, in particular, for the case of an expansion to three or four times its original size or more, it can be reliably ensured that the protective film follows the contours of the protrusions.

If the protective film is expandable it may be used for separating the devices from each other. In particular, the method may further comprise, after processing the one side of the wafer and/or the side of the wafer being opposite to the one side, radially expanding the protective film so as to separate the devices from each other.

For example, the wafer may be fully divided, e.g., by a mechanical cutting process, a laser cutting process or a plasma cutting process, or by a dicing before grinding process. Subsequently, the fully divided devices, which may be in the form of chips or dies, may be moved away from each other by radially expanding the protective film, thereby increasing the distances between adjacent devices.

Alternatively, the wafer may be subjected to a stealth dicing process, i.e., a process in which modified regions are formed within the wafer by the application of a laser beam, as has been detailed above. Subsequently, the wafer may be divided, e.g., broken, along the at least one division line where the modified regions are formed by radially expanding the protective film, thereby obtaining individual chips or dies.

As an alternative to radially expanding the protective film, a separate expansion tape may be attached to the wafer back side, e.g., after removing the protective film. Subsequently, the devices may be separated from each other by radially expanding the expansion tape.

The protective film may be made of a single material, in particular, a single homogeneous material.

The protective film may be made of a plastic material, such as a polymer. Particularly preferably, the protective film is made of a polyolefin. For example, the protective film may be made of polyethylene (PE), polypropylene (PP) or polybutylene (PB).

Polyolefin films have material properties which are especially advantageous for use in the wafer processing methods of the present invention, in particular, if applying the external stimulus to the protective film comprises or consists of heating the protective film. Polyolefin films are pliable, stretchable and soft when in a heated state, e.g., when heated to a temperature in the range of 60° C. to 150° C. Thus, it can be particularly reliably ensured that the protective film conforms to the wafer surface on the side of the wafer being opposite to the one side, for example, absorbing the wafer topography. This is particularly beneficial if the wafer back side is formed with protrusions or projections protruding from a plane surface of the wafer.

Further, polyolefin films harden and stiffen upon cooling down, so as to become more rigid and robust in the cooled down state. Hence, particularly reliable protection of the wafer during subsequent processing of the wafer, such as cutting the wafer, can be ensured.

The protective film may have a thickness in the range of 5 to 200 µm, preferably 8 to 100 µm, more preferably 10 to 80 µm and even more preferably 12 to 50 µm. Particularly preferably, the protective film has a thickness in the range of 80 to 150 µm.

In this way, it can be particularly reliably ensured that the protective film is flexible and pliable enough to sufficiently conform to the contours of protrusions formed on the wafer back side, if such protrusions are present, and, at the same time, exhibits a sufficient thickness in order to reliably and efficiently protect the wafer during processing the front side and/or the back side thereof.

A cushioning layer may be attached to a back surface of the protective film opposite to the front surface thereof.

This approach is particularly advantageous, if protrusions or projections, such as surface unevenness or roughness, bumps, optical elements, e.g., optical lenses, other structures or the like, protrude, extend or project from the side of the wafer being opposite to the one side along the thickness direction of the wafer. In this case, the protrusions or projections define a surface structure or topography of the wafer back side, rendering this side uneven.

If the cushioning layer is attached to the back surface of the protective film, such protrusions can be embedded in the cushioning layer. Hence, any negative influence of the surface unevenness arising from the presence of the protrusions on subsequent wafer processing steps, such as cutting, can be eliminated. In particular, the cushioning layer can significantly contribute to achieving a particularly uniform and homogeneous distribution of pressure during a cutting process.

By embedding the protrusions in the cushioning layer, the protrusions, such as for example optical elements or other structures, are reliably protected from any damage during wafer processing, for example, in a subsequent cutting step.

The material of the cushioning layer is not particularly limited. In particular, the cushioning layer may be formed of any type of material which allows for protrusions protruding along the thickness direction of the wafer to be embedded therein. For example, the cushioning layer may be formed of a resin, an adhesive, a gel or the like.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be configured so as to exhibit a degree of compressibility, elasticity and/or flexibility after curing thereof, i.e., to be compressible, elastic and/or flexible after curing. For example, the cushioning layer may be such that it is brought into a rubber-like state by curing. Alternatively, the cushioning layer may be configured so as to reach a rigid, hard state after curing.

Preferred examples of UV curable resins for use as the cushioning layer in the methods of the invention are ResiFlat by the DISCO Corporation and TEMPLOC by DENKA.

The method may further comprise applying the external stimulus to the cushioning layer so as to cure the cushioning layer, before processing, e.g., cutting, the wafer. In this way, the protection of the wafer during cutting and the cutting accuracy can be further improved.

The cushioning layer may be heat resistant up to a temperature of 180° C. or more, preferably up to a temperature of 220° C. or more, more preferably up to a temperature of 250° C. or more, and even more preferably up to a temperature of 300° C. or more.

The cushioning layer may have a thickness in the range of 10 to 300 µm, preferably 20 to 250 µm and more preferably 50 to 200 µm.

The cushioning layer may be attached to the back surface of the protective film before applying the protective film to the side of the wafer being opposite to the one side.

In this case, the protective film and the cushioning layer may be laminated first, forming a protective sheeting comprising the cushioning layer and the protective film attached to the cushioning layer. The protective sheeting formed in this manner may be subsequently applied to the side of the wafer being opposite to the one side, e.g., such that protrusions or projections protruding from the plane surface of the wafer are covered by the protective film and embedded in the protective film and the cushioning layer. The protective sheeting may be applied so that the back surface of the cushioning layer is substantially parallel to the one side of the wafer. The front surface of the protective film is applied to the side of the wafer being opposite to the one side when the protective sheeting is applied to the side of the wafer being opposite to the one side.

In this way, the wafer processing method can be carried out in a particularly simple and efficient manner. For example, the protective sheeting can be prepared in advance, stored for later use and used for wafer processing when required. The protective sheeting may thus be manufactured in large quantities, rendering the production thereof particularly efficient in terms of both time and cost.

The cushioning layer may be attached to the back surface of the protective film after applying the protective film to the side of the wafer being opposite to the one side.

In this case, the protective film is applied to the side of the wafer being opposite to the one side first, and the side of the wafer being opposite to the one side, having the protective film applied thereto, is subsequently attached to the front surface of the cushioning layer, e.g., so that protrusions or projections protruding from the plane surface of the wafer are embedded in the protective film and the cushioning layer, and the back surface of the cushioning layer is substantially parallel to the one side of the wafer. This approach allows for the protective film to be attached to the side of the wafer being opposite to the one side with a particularly high degree of accuracy, in particular, in relation to protrusions or projections protruding from the plane surface of the wafer.

The cushioning layer may be attached to the back surface of the protective film before and/or during and/or after attaching the protective film to the one side of the wafer.

The method may further comprise removing the protective film and the cushioning layer from the wafer. The protective film and the cushioning layer may be removed from the wafer after processing, such as cutting, the wafer.

The cushioning layer and the protective film may be removed individually, i.e., one after the other. For example, the cushioning layer may be removed first, followed by the removal of the protective film or sheet. Alternatively, the cushioning layer and the protective film may be removed together.

A base sheet may be attached to the back surface of the cushioning layer opposite to the front surface thereof which is attached to the protective film.

The material of the base sheet is not particularly limited. The base sheet may be made of a soft or pliable material, such as, for example, a polymer material, e.g., polyvinyl chloride (PVC), ethylene vinyl acetate (EVA) or a polyolefin.

Alternatively, the base sheet may be made of a rigid or hard material, such as polyethylene terephthalate (PET) and/or silicon and/or glass and/or stainless steel (SUS).

For example, if the base sheet is made of polyethylene terephthalate (PET) or glass and the cushioning layer is curable by an external stimulus, the cushioning layer may be cured with radiation that is transmittable through polyethylene terephthalate (PET) or glass, for instance UV radiation. If the base sheet is made of silicon or stainless steel (SUS), a cost-efficient base sheet is provided.

Also, the base sheet may be formed of a combination of the materials listed above.

The base sheet may be heat resistant up to a temperature of 180° C. or more, preferably up to a temperature of 220° C. or more, more preferably up to a temperature of 250° C. or more, and even more preferably up to a temperature of 300° C. or more.

The base sheet may have a thickness in the range of 30 to 1500 µm, preferably 40 to 1200 µm and more preferably 50 to 1000 µm.

The cushioning layer and the base sheet may be attached to the back surface of the protective film before or after applying the protective film to the back side of the wafer.

In particular, the protective film, the cushioning layer and the base sheet may be laminated first, forming a protective sheeting comprising the base sheet, the cushioning layer and the protective film attached to the cushioning layer. The protective sheeting formed in this manner may be subsequently applied to the wafer back side.

The front surface of the base sheet may be in contact with the back surface of the cushioning layer, and a back surface of the base sheet opposite to the front surface thereof may be substantially parallel to the one side of the wafer. Thus, when processing, e.g., cutting, the one side of the wafer, a suitable counter pressure can be applied to the back surface of the base sheet, e.g., by placing this back surface on a chuck table.

In this case, since the plane back surface of the base sheet is substantially parallel to the front side of the wafer, pressure applied to the wafer during processing, such as a cutting process, e.g., by a cutting or dicing blade of a cutting apparatus, is more evenly and homogeneously distributed over the wafer, thus minimising any risk of breakage of the wafer. Further, the substantially parallel alignment of the flat, even back surface of the base sheet and the front side of the wafer allows for a cutting step to be carried out with a high degree of precision, thus achieving the production of high quality dies or chips with well-defined shapes and sizes.

The method may further comprise grinding and/or polishing and/or etching, e.g., plasma etching, the side of the wafer being opposite to the one side, in particular, before applying the protective film to the wafer. The side of the wafer being opposite to the one side may be ground for adjusting the wafer thickness.

The invention further provides a method of processing a wafer, having on one side a device area with a plurality of devices, wherein at least one division line is formed on the one side of the wafer. The method comprises removing wafer material along the at least one division line from the one side of the wafer, providing a protective film, and, after removing wafer material along the at least one division line, applying the protective film, for covering the devices on the wafer, to the one side of the wafer, so that at least a central area of a front surface of the protective film is in direct contact with the one side of the wafer. The method further comprises applying an external stimulus to the protective film during and/or after applying the protective film to the one side of the wafer, so that the protective film is attached to the one side of the wafer, and, after applying the external stimulus to the protective film, grinding the side of the wafer being opposite to the one side to adjust the wafer thickness. The wafer material is removed along only a part of the thickness of the wafer, and grinding the side of the wafer being opposite to the one side is performed along a remaining part of the thickness of the wafer in which no wafer material has been removed, so as to divide the wafer along the at least one division line.

The wafer may have the properties, characteristics and features described in detail above.

The wafer may have any type of shape. In a top view thereon, the wafer may have, for example, a circular shape, an oval shape, an elliptical shape or a polygonal shape, such as a rectangular shape or a square shape.

The protective film may have the properties, characteristics and features described in detail above. In particular, the protective film may be used in combination with a cushioning layer or in combination with a cushioning layer and a base sheet as described in detail above.

The protective film may have any type of shape. In a top view thereon, the protective film may have, for example, a circular shape, an oval shape, an elliptical shape or a polygonal shape, such as a rectangular shape or a square shape.

The protective film may have substantially the same shape or the same shape as the wafer.

The protective film may be applied to the one side of the wafer in the same manner as detailed above for applying the protective film to the side of the wafer being opposite to the one side.

In particular, the protective film is applied to the one side of the wafer, i.e., to the wafer front side, so that at least the central area of the front surface of the protective film is in direct contact with the one side of the wafer. Thus, no material, in particular, no adhesive, is present between at least the central area of the front surface of the protective film and the one side of the wafer.

Therefore, the risk of a possible contamination of or damage to the wafer, in particular, the devices formed in the device area, e.g., due to an adhesive force of an adhesive layer or adhesive residues on the wafer, can be significantly reduced or even eliminated.

The external stimulus and the process of applying the external stimulus to the protective film may have the properties, characteristics and features described in detail above.

In particular, applying the external stimulus to the protective film may comprise or consist of heating the protective film and/or cooling the protective film and/or applying a vacuum to the protective film and/or irradiating the protective film with radiation, such as light, e.g., by using a laser beam.

The external stimulus may comprise or be a chemical compound and/or electron or plasma irradiation and/or mechanical treatment, such as pressure, friction or ultrasound application, and/or static electricity.

Particularly preferably, applying the external stimulus to the protective film comprises or consists of heating the protective film. For example, applying the external stimulus to the protective film may comprise or consist of heating the protective film and applying a vacuum to the protective film. In this case, the vacuum may be applied to the protective film during and/or before and/or after heating the protective film.

If applying the external stimulus to the protective film comprises or consists of heating the protective film, the method may further comprise allowing the protective film to cool down after the heating process. In particular, the protective film may be allowed to cool down to its initial temperature, i.e., to the temperature thereof prior to the heating process. The protective film may be allowed to cool down, e.g., to its initial temperature, before grinding the side of the wafer being opposite to the one side, i.e., the wafer back side.

The wafer material may be removed along the at least one division line in the same manner as detailed above.

In particular, the wafer material may be mechanically removed along the at least one division line. For example, the wafer material may be removed along the at least one division line by mechanically cutting the wafer along the at least one division line, e.g., by blade dicing or sawing. Alternatively or in addition, the wafer material may be removed along the at least one division line by laser cutting and/or by plasma cutting.

The process of removing wafer material along the at least one division line may be performed so that, in the plane of the wafer, wafer material is removed all the way to lateral edges of the wafer, or so that no wafer material is removed in a peripheral portion of the wafer, for example, in the peripheral marginal area. If no wafer material is removed in a peripheral portion of the wafer, the device area can be particularly reliably protected against contamination. In particular, the protective film can be attached to the peripheral portion of the wafer in especially close contact to the wafer surface, thus efficiently sealing the device area.

In the method, grinding of the side of the wafer being opposite to the one side is performed along a remaining part of the thickness of the wafer in which no wafer material has been removed, so as to divide the wafer along the at least one division line. By dividing the wafer in the grinding step in this way, the wafer can be processed in a particularly reliable, accurate and efficient manner. Specifically, the step of removing wafer material along the at least one division line is performed on the wafer before grinding, i.e., before a reduction in thickness thereof. Hence, any deformation of the wafer during material removal, e.g., during cutting, along the at least one division line, such as wafer warpage or the like, can be reliably avoided. Further, the stress applied to the wafer during wafer material removal along the at least one division line is significantly reduced, allowing for chips or dies with an increased die strength to be obtained. Any damage to the resulting chips or dies, such as the formation of cracks or back side chipping, can be prevented.

Moreover, since the wafer material is removed along the at least one division line only along part of the wafer thickness, the efficiency, in particular, the processing speed, of the wafer material removal process is enhanced. Also, the service life of a means, e.g., a cutting means, used for the wafer material removing step is extended.

During and/or after applying the protective film to the one side of the wafer, the external stimulus is applied to the protective film, so that the protective film is attached to the one side of the wafer. An attachment force between protective film and wafer, holding the protective film in its position on the wafer, is thus generated through the application of the external stimulus. Hence, no additional adhesive material is necessary for attaching the protective film to the one side of the wafer. In particular, by applying the external stimulus to the protective film, a form fit, such as a positive fit, and/or a material bond, such as an adhesive bond, may be formed between the protective film and the wafer.

The method of the present invention thus enables reliable and efficient processing of a wafer having a device area, minimising any risk of contamination and damage to the wafer.

The wafer front side surface may be a substantially flat, even surface or a flat, even surface.

Alternatively, the device area may be formed with a plurality of protrusions or projections protruding from a plane surface of the wafer. The protrusions or projections protruding from the plane surface of the wafer may be embedded in the protective film.

The protrusions or projections, such as bumps, may protrude, extend or project from a plane surface of the wafer which is a substantially flat surface. The protrusions or projections may define a surface structure or topography of the one side of the wafer, i.e., the front side thereof, rendering this one side uneven.

These protrusions or projections may be used, for example, for establishing an electrical contact with the devices in individual chips or dies after the wafer has been divided, e.g., when incorporating the chips or dies in electronic equipment, such as mobile phones and personal computers.

The protrusions may be irregularly arranged or arranged in a regular pattern. Only some of the protrusions may be arranged in a regular pattern.

The protrusions may have any type of shape. For example, some or all of the protrusions may be in the shape of spheres, semi-spheres, pillars or columns, e.g., pillars or columns with a circular, elliptic or polygonal, such as triangular, square etc., cross-section or base area, cones, truncated cones or steps.

At least some of the protrusions may arise from elements formed on the plane surface of the wafer. At least some of the protrusions may arise from elements partly or entirely penetrating the wafer in its thickness direction, e.g., for the case of a through silicon via (TSV). These latter elements may extend along part of the wafer thickness or along the entire wafer thickness.

The protrusions may have a height in the thickness direction of the wafer in the range of 20 to 500 µm, preferably 30 to 400 µm, more preferably 40 to 250 µm, even more preferably 50 to 200 µm and yet even more preferably 70 to 150 µm.

All the protrusions may have substantially the same shape and/or size. Alternatively, at least some of the protrusions may differ from each other in shape and/or size.

In the method of the present invention, the protrusions or projections protruding from the plane surface of the wafer may be embedded in the protective film. Hence, any negative influence of the surface unevenness arising from the presence of the protrusions in the device area on subsequent wafer processing steps, in particular, grinding the wafer back side, can be reduced or even eliminated.

In particular, by embedding the protrusions in the protective film, the protrusions can be protected from any damage during wafer processing, for example, in the subsequent grinding step.

Further, if the wafer is ground to a small thickness, e.g., a thickness in the μm range, the protrusions of the device area on the front side of the wafer may cause a deformation of the wafer back side, due to the reduced thickness of the wafer and the pressure applied thereto in the grinding process. This latter effect is referred to as "pattern transfer", since the pattern of the protrusions on the wafer front side is transferred to the wafer back side, and results in an undesired unevenness of the back side surface of the wafer, thus compromising the quality of the resulting chips or dies.

The protective film acts as a cushion or buffer between the wafer front side and, for example, a support or carrier on which the wafer front side rests during processing, e.g., grinding and/or polishing, the wafer back side, thus contributing to achieving a uniform and homogeneous distribution of pressure during processing. Hence, a pattern transfer or breakage of the wafer during processing, in particular, grinding, the back side thereof can be prevented.

The protective film may be expandable. The protective film may be expanded when being applied to the one side of the wafer. If protrusions are present on the one side of the wafer, the protective film may be expanded when being applied to the one side of the wafer so as to closely or at least partly follow the contours of these protrusions.

In particular, the protective film may be expandable to twice its original size or more, preferably three times its original size or more and more preferably four times its original size or more. In this way, in particular, for the case of an expansion to three or four times its original size or more, it can be reliably ensured that the protective film follows the contours of the protrusions.

If the protective film is expandable it may be used for separating the devices from each other. In particular, the method may further comprise, after grinding the side of the wafer being opposite to the one side, radially expanding the protective film so as to separate the devices from each other.

The wafer is fully divided along the at least one division line by grinding the back side thereof, as has been detailed above. Subsequently, the fully divided devices, which may be in the form of chips or dies, may be moved away from each other by radially expanding the protective film, thereby increasing the distances between adjacent devices. In this way, any damage to the devices due to an unintended contact therebetween, e.g., due to adjacent devices touching each other or rubbing against each other, can be reliably avoided.

The method may comprise, after grinding the side of the wafer being opposite to the one side, attaching an expandable adhesive tape, such as an expansion tape, to the side of the wafer being opposite to the one side, and radially expanding the adhesive tape so as to separate the devices from each other. Also in this way, the fully divided devices may be moved away from each other, thereby increasing the distances between adjacent devices. This approach is particularly advantageous if a protective film is used which is not expandable.

Prior to attaching the adhesive tape to the side of the wafer being opposite to the one side, the protective film may be removed.

The method may further comprise, after grinding the side of the wafer being opposite to the one side, polishing and/or etching, e.g., plasma etching, the side of the wafer being opposite to the one side.

The protective film may be applied to the one side of the wafer so that, in the entire region where the front surface of the protective film is in contact with the one side of the wafer, the front surface of the protective film is in direct contact with the one side of the wafer. Thus, no material, in particular, no adhesive, is present between the front surface of the protective film and the one side of the wafer.

In this way, the risk of a possible contamination of or damage to the wafer, in particular, the devices formed in the device area, e.g., due to an adhesive force of an adhesive layer or adhesive residues on the wafer, can be reliably eliminated.

Alternatively, the protective film may be provided with an adhesive layer, wherein the adhesive layer is provided only in a peripheral area of the front surface of the protective film, the peripheral area surrounding the central area of the front surface of the protective film, and the protective film is applied to the one side of the wafer so that the adhesive layer comes into contact only with a peripheral portion of the one side of the wafer, such as the peripheral marginal area.

In this way, the attachment of the protective film to the wafer can be further improved. Since the adhesive layer is provided only in the peripheral area of the front surface of the protective film, the area in which protective film and wafer are attached to each other by the adhesive layer is significantly reduced as compared to a case where an adhesive layer is provided on the entire front surface of the protective film. Thus, the protective film can be detached from the wafer more easily and the risk of damage to the wafer, in particular, to protrusions formed on the front side thereof, e.g., in the device area, is considerably reduced or even eliminated.

The adhesive of the adhesive layer may be curable by an external stimulus, such as heat, UV radiation, an electric field and/or a chemical agent. In this way, the protective film can be particularly easily removed from the wafer after processing. The external stimulus may be applied to the adhesive so as to lower the adhesive force thereof, thus allowing for an easy removal of the protective film.

For example, the adhesive layer may have a substantially annular shape, an open rectangular shape or an open square shape.

A cushioning layer may be attached to a back surface of the protective film opposite to the front surface thereof.

The cushioning layer may have the properties, characteristics and features described in detail above. The cushioning layer may be attached to the back surface of the protective film in the same manner as detailed above. The disclosure provided above with regard to the cushioning layer fully applies.

Attaching a cushioning layer to the back surface of the protective film is particularly advantageous if protrusions or projections are present at the one side of the wafer, in particular, in the device area. In this case, the protrusions or projections define a surface structure or topography of the wafer front side, rendering this side uneven.

If the cushioning layer is attached to the back surface of the protective film, such protrusions can be embedded in the cushioning layer. Hence, any negative influence of the surface unevenness arising from the presence of the protrusions on subsequent wafer processing steps, in particular, grinding the wafer back side, can be eliminated. In particular, the cushioning layer can significantly contribute to achieving a particularly uniform and homogeneous distribution of pressure during the grinding process. By embedding the protrusions in the cushioning layer, the protrusions are reliably protected from any damage during wafer processing, for example, in the grinding step.

The cushioning layer may be attached to the back surface of the protective film so that the back surface of the cushioning layer is substantially parallel to the side of the wafer being opposite to the one side.

The cushioning layer may be curable by an external stimulus, such as UV radiation, heat, an electric field and/or a chemical agent.

The method may further comprise applying the external stimulus to the cushioning layer so as to cure the cushioning layer, after applying the protective film to the one side of the wafer.

A base sheet may be attached to a back surface of the cushioning layer.

The base sheet may have the properties, characteristics and features described in detail above. The base sheet may be attached to the back surface of the cushioning layer in the same manner as detailed above. The disclosure provided above with regard to the base sheet fully applies.

A front surface of the base sheet may be in contact with the back surface of the cushioning layer. A back surface of the base sheet opposite to the front surface thereof may be substantially parallel to the side of the wafer being opposite to the one side.

In this case, since the plane back surface of the base sheet is substantially parallel to the back side of the wafer, the pressure applied to the wafer during processing, such as grinding, e.g., by a grinding wheel of a grinding apparatus, is evenly and homogeneously distributed over the wafer, thus minimising any risk of a pattern transfer, i.e., a transfer of a pattern defined by protrusions or projections in the device area to the processed, in particular, ground, wafer back side, and breakage of the wafer. Further, the substantially parallel alignment of the flat, even back surface of the base sheet and the back side of the wafer allows for the grinding step to be carried out with a high degree of precision, thus achieving a particularly uniform and homogeneous wafer thickness after grinding.

Also, the protective film acts as a further cushion or buffer between the wafer front side and the cushioning layer, thus further contributing to the uniform and homogeneous distribution of pressure during processing, such as grinding. Hence, a pattern transfer or breakage of the wafer during processing can be particularly reliably prevented.

The invention further provides a method of processing a wafer, having on one side a device area with a plurality of devices. The method comprises providing a protective film having an adhesive layer, applying the protective film, for covering the devices on the wafer, to the one side of the wafer, so that a central area of a front surface of the protective film is in direct contact with the one side of the wafer, applying an external stimulus to the protective film during and/or after applying the protective film to the one side of the wafer, so that the protective film is attached to the one side of the wafer, and processing the side of the wafer being opposite to the one side. The adhesive layer is provided only in a peripheral area of the front surface of the protective film, wherein the peripheral area surrounds the central area of the front surface of the protective film. The protective film is applied to the one side of the wafer so that the adhesive layer comes into contact only with a peripheral portion of the one side of the wafer, such as a peripheral marginal area of the wafer.

The wafer may have the properties, characteristics and features described in detail above.

The wafer may have any type of shape. In a top view thereon, the wafer may have, for example, a circular shape, an oval shape, an elliptical shape or a polygonal shape, such as a rectangular shape or a square shape.

The protective film may have the properties, characteristics and features described in detail above. In particular, the protective film may be used in combination with a cushioning layer or in combination with a cushioning layer and a base sheet as described in detail above.

The protective film may have any type of shape. In a top view thereon, the protective film may have, for example, a circular shape, an oval shape, an elliptical shape or a polygonal shape, such as a rectangular shape or a square shape.

The protective film may have substantially the same shape or the same shape as the wafer.

The protective film may be applied to the one side of the wafer in the same manner as detailed above.

In particular, the protective film is applied to the one side of the wafer, i.e., to the wafer front side, so that the central area of the front surface of the protective film is in direct contact with the one side of the wafer. Thus, no material, in particular, no adhesive, is present between the central area of the front surface of the protective film and the one side of the wafer.

Therefore, the risk of a possible contamination of or damage to the wafer, in particular, the devices formed in the device area, e.g., due to the adhesive force of the adhesive layer or adhesive residues on the wafer, can be significantly reduced.

The wafer front side surface may be a substantially flat, even surface or a flat, even surface. Alternatively, protrusions or projections protruding from a plane wafer surface along the thickness direction of the wafer may be present on the front side of the wafer, in particular, in the device area.

The external stimulus and the process of applying the external stimulus to the protective film may have the properties, characteristics and features described in detail above.

In particular, applying the external stimulus to the protective film may comprise or consist of heating the protective film and/or cooling the protective film and/or applying a vacuum to the protective film and/or irradiating the protective film with radiation, such as light, e.g., by using a laser beam.

The external stimulus may comprise or be a chemical compound and/or electron or plasma irradiation and/or mechanical treatment, such as pressure, friction or ultrasound application, and/or static electricity.

Particularly preferably, applying the external stimulus to the protective film comprises or consists of heating the protective film. For example, applying the external stimulus to the protective film may comprise or consist of heating the protective film and applying a vacuum to the protective film. In this case, the vacuum may be applied to the protective film during and/or before and/or after heating the protective film.

If applying the external stimulus to the protective film comprises or consists of heating the protective film, the method may further comprise allowing the protective film to cool down after the heating process. In particular, the protective film may be allowed to cool down to its initial temperature, i.e., to the temperature thereof prior to the heating process. The protective film may be allowed to cool down, e.g., to its initial temperature, before processing the side of the wafer being opposite to the one side, i.e., the wafer back side.

Processing the side of the wafer being opposite to the one side may be performed in the manner detailed above.

During and/or after applying the protective film to the one side of the wafer, the external stimulus is applied to the protective film, so that the protective film is attached to the one side of the wafer. An attachment force between protective film and wafer, holding the protective film in its position on the wafer, is thus generated through the application of the external stimulus. In particular, by applying the external stimulus to the protective film, a form fit, such as a positive fit, and/or a material bond, such as an adhesive bond, may be formed between the protective film and the wafer. In addition, the protective film is attached to the wafer by the adhesive layer. In this way, the attachment of the protective film to the wafer is further improved.

Since the adhesive layer is provided only in the peripheral area of the front surface of the protective film, the area in which protective film and wafer are attached to each other by the adhesive layer is significantly reduced as compared to a case where an adhesive layer is provided on the entire front surface of the protective film. Thus, the protective film can be detached from the wafer more easily and the risk of damage to the wafer, in particular, to protrusions formed on the front side thereof, is considerably reduced.

The method of the present invention thus enables reliable and efficient processing of a wafer having a device area, minimising any risk of contamination and damage to the wafer.

The adhesive of the adhesive layer may be curable by an external stimulus, such as heat, UV radiation, an electric field and/or a chemical agent. In this way, the protective film can be particularly easily removed from the wafer after processing. The external stimulus may be applied to the adhesive so as to lower the adhesive force thereof, thus allowing for an easy removal of the protective film.

For example, the adhesive layer may have a substantially annular shape, an open rectangular shape or an open square shape.

A cushioning layer may be attached to a back surface of the protective film opposite to the front surface thereof.

The cushioning layer may have the properties, characteristics and features described in detail above. The cushioning layer may be attached to the back surface of the protective film in the same manner as detailed above. The disclosure provided above with regard to the cushioning layer fully applies.

Attaching a cushioning layer to the back surface of the protective film is particularly advantageous if protrusions or projections are present at the one side of the wafer, in particular, in the device area. In this case, the protrusions or projections define a surface structure or topography of the wafer front side, rendering this side uneven.

If the cushioning layer is attached to the back surface of the protective film, such protrusions can be embedded in the cushioning layer. Hence, any negative influence of the surface unevenness arising from the presence of the protrusions on subsequent wafer processing steps, such as grinding, cutting or polishing, can be eliminated. In particular, the cushioning layer can significantly contribute to achieving a particularly uniform and homogeneous distribution of pressure during such processing. By embedding the protrusions in the cushioning layer, the protrusions are reliably protected from any damage during wafer processing, for example, in a grinding step.

The cushioning layer may be attached to the back surface of the protective film so that the back surface of the cushioning layer is substantially parallel to the side of the wafer being opposite to the one side.

The cushioning layer may be curable by an external stimulus, such as UV radiation, heat, an electric field and/or a chemical agent.

The method may further comprise applying the external stimulus to the cushioning layer so as to cure the cushioning layer, after applying the protective film to the one side of the wafer.

A base sheet may be attached to a back surface of the cushioning layer.

The base sheet may have the properties, characteristics and features described in detail above. The base sheet may be attached to the back surface of the cushioning layer in the same manner as detailed above. The disclosure provided above with regard to the base sheet fully applies.

A front surface of the base sheet may be in contact with the back surface of the cushioning layer. A back surface of the base sheet opposite to the front surface thereof may be substantially parallel to the side of the wafer being opposite to the one side.

In this case, since the plane back surface of the base sheet is substantially parallel to the back side of the wafer, the pressure applied to the wafer during processing, such as grinding, e.g., by a grinding wheel of a grinding apparatus, is evenly and homogeneously distributed over the wafer, thus minimising any risk of a pattern transfer, as has been detailed above. Further, the substantially parallel alignment of the flat, even back surface of the base sheet and the back side of the wafer allows for a grinding step to be carried out with a high degree of precision, thus achieving a particularly uniform and homogeneous wafer thickness after grinding.

Also, the protective film acts as a further cushion or buffer between the wafer front side and the cushioning layer, thus further contributing to the uniform and homogeneous distribution of pressure during processing, such as grinding. Hence, a pattern transfer or breakage of the wafer during processing can be particularly reliably prevented.

Processing the side of the wafer being opposite to the one side may comprise or consist of grinding the side of the wafer being opposite to the one side to adjust the wafer thickness.

Processing the side of the wafer being opposite to the one side may comprise or consist of polishing the side of the wafer being opposite to the one side, for example, after grinding the side of the wafer being opposite to the one side.

At least one division line may be formed on the one side of the wafer. A plurality of division lines may be formed on the one side of the wafer. The one or more division lines partition the devices formed in the device area.

Processing the side of the wafer being opposite to the one side may comprise or consist of removing wafer material along the at least one division line, for example, after grinding the side of the wafer being opposite to the one side. If a plurality of division lines is formed on the one side of the wafer, processing the side of the wafer being opposite to the one side may comprise or consist of removing wafer material along each of the plurality of division lines, for example, after grinding the side of the wafer being opposite to the one side.

The wafer material may be removed along the at least one division line throughout the entire thickness of the wafer. In this case, the wafer is divided along the at least one division line into a plurality of chips or dies by the wafer material removal process.

Alternatively, the wafer material may be removed along the at least one division line along only part of the thickness of the wafer. For example, the wafer material may be removed along 20% or more, 30% or more, 40% or more, 50% or more, 60% or more, 70% or more, 80% or more, or 90% or more of the thickness of the wafer.

In this case, a process of dividing, i.e., fully dividing, the wafer may be carried out, for example, by adopting a breaking process, applying an external force to the wafer, e.g., using an expansion tape, or by adopting a cutting or dicing process, such as a mechanical cutting or dicing process, a laser cutting or dicing process or a plasma cutting or dicing process. For example, an external force may be applied to the wafer by radially expanding the protective film, i.e., by using the protective film as an expansion tape. Further, also a combination of two or more of these processes may be employed.

The wafer material may be mechanically removed along the at least one division line. In particular, the wafer material may be removed along the at least one division line by mechanically cutting the wafer along the at least one division line, e.g., by blade dicing or sawing. In this case, the wafer is cut from the back side thereof.

Alternatively or in addition, the wafer material may be removed along the at least one division line by laser cutting and/or by plasma cutting.

The wafer may be cut in a single mechanical cutting step, a single laser cutting step or a single plasma cutting step. Alternatively, the wafer may be cut by a sequence of mechanical cutting and/or laser cutting and/or plasma cutting steps.

Laser cutting may be performed, for example, by ablation laser cutting and/or by stealth laser cutting, i.e., by forming modified regions within the wafer by the application of a laser beam, as has been detailed above, and/or by forming a plurality of hole regions in the wafer by the application of a laser beam. Each of these hole regions may be composed of a modified region and a space in the modified region open to a surface of the wafer.

In such a stealth laser cutting or stealth dicing process, a pulsed laser beam may be applied to the wafer from the side of the wafer being opposite to the one side, wherein the wafer is made of a material which is transparent to the pulsed laser beam and the pulsed laser beam is applied to the wafer at least in a plurality of positions along the at least one division line, in a condition where a focal point of the pulsed laser beam is located at a distance from the side of the wafer being opposite to the one side in the direction from the side of the wafer being opposite to the one side towards the one side of the wafer, so as to form a plurality of modified regions in the wafer along the at least one division line.

The method may further comprise, after forming the plurality of modified regions in the wafer, dividing the wafer along the at least one division line. The process of dividing the wafer may be carried out in various ways, e.g., by adopting a breaking process, applying an external force to the wafer, for example, using an expansion tape, or by adopting a cutting or dicing process, such as a mechanical cutting or dicing process, a laser cutting or dicing process or a plasma cutting or dicing process. For example, an external force may be applied to the wafer by radially expanding the protective film, i.e., by using the protective film as an expansion tape, as will be further detailed in the following. Further, also a combination of two or more of these processes may be employed.

The protective film may be expandable. In this case, the protective film may be used for separating the devices from each other. In particular, the method may further comprise, after processing the side of the wafer being opposite to the one side, radially expanding the protective film so as to separate the devices from each other.

For example, the wafer may be fully divided, e.g., by a mechanical cutting process, a laser cutting process or a plasma cutting process. Subsequently, the fully divided devices, which may be in the form of chips or dies, may be moved away from each other by radially expanding the protective film, thereby increasing the distances between adjacent devices.

Alternatively, the wafer may be subjected to a stealth laser cutting or stealth dicing process. Subsequently, the wafer may be divided, e.g., broken, along the at least one division line where the modified regions are formed by radially expanding the protective film, thereby obtaining individual chips or dies.

As an alternative to radially expanding the protective film, a separate expansion tape may be attached to the wafer front side or back side, e.g., after removing the protective film. Subsequently, the devices may be separated from each other by radially expanding the expansion tape.

The method may comprise, e.g., after grinding the back side of the wafer, attaching an expandable adhesive tape, such as an expansion tape, to the wafer back side. Before or after attaching the adhesive tape to the wafer back side, the protective film may be removed, so as to expose the wafer front side.

The method may comprise, e.g., after attaching the adhesive tape to the wafer back side and/or removing the protective film, removing wafer material along the at least one division line. The wafer material may be removed along the at least one division line from the wafer front side.

Removing wafer material along the at least one division line may be performed in the manner detailed above. For example, the wafer may be cut along the at least one division line from the wafer front side, or a stealth laser cutting or stealth dicing process may be performed along the at least one division line from the wafer front side.

After removing wafer material along the at least one division line or after performing a stealth laser cutting or stealth dicing process, the devices may be separated from each other, e.g., by radially expanding the adhesive tape.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods for processing a wafer W.

Figure 1:
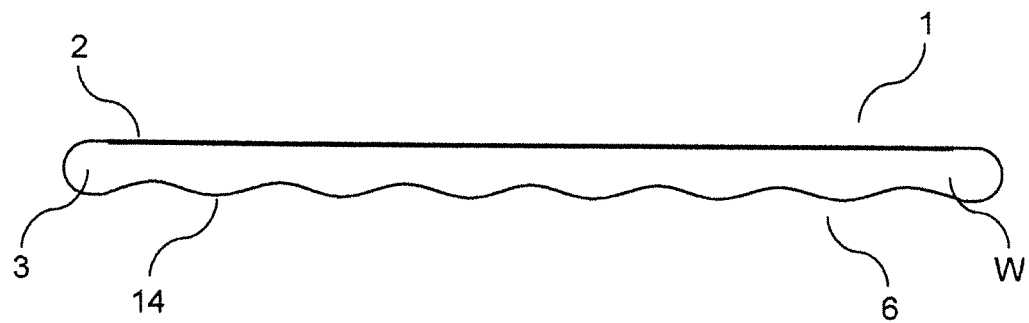
FIG. 1 is a cross-sectional view showing a wafer to be processed by a method of the present invention.

The wafer W can be, for example, a MEMS wafer having MEMS devices formed on the surface of a front side 1 thereof (see FIG. 1). However, the wafer W is not limited to a MEMS wafer, but may also be a CMOS wafer having CMOS devices, preferably as solid-state imaging devices, formed on the front side 1 thereof or a wafer with other types of devices on the front side 1.

The wafer W may be made of a semiconductor, e.g., silicon (Si). Such a silicon wafer W can include devices, such as ICs (integrated circuits) and LSIs (large scale integrations), on a silicon substrate. Alternatively, the wafer may be an optical device wafer configured by forming optical devices, such as LEDs (light emitting diodes), on an inorganic material substrate of, for example, ceramic, glass or sapphire. The wafer W is not limited to this and can be formed in any other way. Furthermore, also a combination of the above described exemplary wafer designs is possible.

The wafer W can have a thickness before grinding in the µm range, preferably in the range of 625 to 925 µm.

The wafer W preferably exhibits a circular shape. However, the shape of the wafer W is not particularly limited. In other embodiments, the wafer W may have, for example, an oval shape, an elliptical shape or a polygonal shape, such as a rectangular shape or a square shape.

The wafer W is provided with a plurality of crossing division lines 11 (see FIG. 2), also termed streets, formed on the front side 1 thereof, thereby partitioning the wafer W into a plurality of rectangular regions where devices 27, such as those described previously, are respectively formed. These devices 27 are formed in a device area 2 of the wafer W. In the case of a circular wafer W, this device area 2 is preferably circular and arranged concentrically with the outer circumference of the wafer W.

Figure 2:
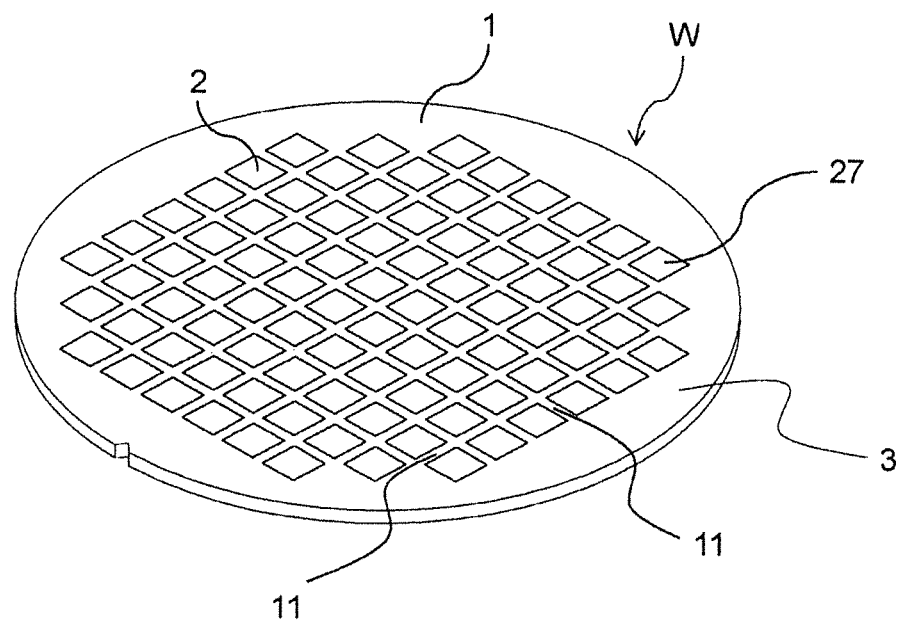
FIG. 2 is a perspective view of the wafer shown in FIG. 1.

The device area 2 is surrounded by an annular peripheral marginal area 3, as is schematically shown in FIGS. 1 and 2. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and preferably ranges from 1 to 3 mm.

The wafer W further has a back side 6 opposite to the front side 1 (see FIG. 1). The back side 6 has a plurality of protrusions 14 protruding along a thickness direction of the wafer W, as is schematically shown, for example, in FIG. 1. The protrusions 14 may be, for example, surface unevenness or roughness, bumps, optical elements, e.g., optical lenses, other structures or the like. The height of the protrusions 14 in the thickness direction of the wafer W may be, for example, in the range of 5 to 300 µm. The protrusions 14 illustrated, e.g., in FIG. 1 are not drawn to scale but shown in enlarged form for better presentability.

In the following, a method of processing a wafer W according to an embodiment of the present invention will be described with reference to FIGS. 1 to 8.

Figure 3:
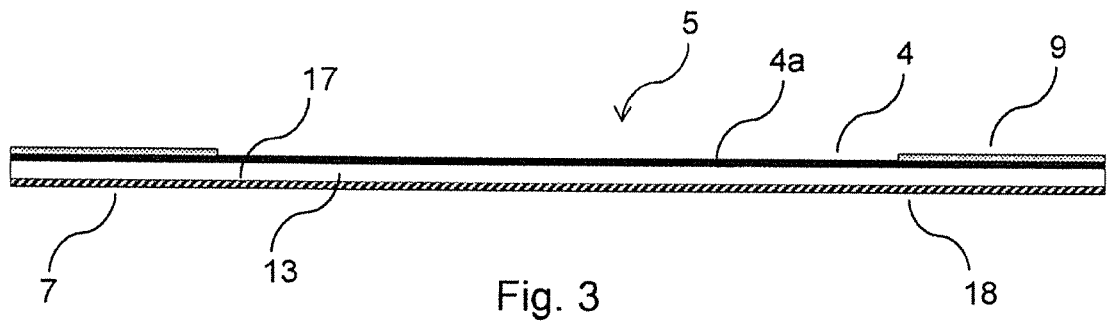
FIG. 3 is a cross-sectional view showing an embodiment of a protective sheeting to be used in a method of processing the wafer according to the present invention.

FIG. 1 shows a cross-sectional view of the wafer W to be processed by the method of the present invention. FIG. 2 shows a perspective view of the wafer W shown in cross-section in FIG. 1. FIG. 3 shows a cross-sectional view of a protective sheeting 5 to be used in the method of processing the wafer W.

As is shown in FIG. 3, the protective sheeting 5 comprises a base sheet 7, a cushioning layer 13 applied to a front surface 17 of the base sheet 7, a protective film 4, a back surface of which is attached to the cushioning layer 13, and an adhesive layer 9 applied to a part of a front surface 4a of the protective film 4 opposite to the back surface thereof. Specifically, the adhesive layer 9 has an annular shape and is provided only in a circumferential or peripheral area of the front surface 4a of the protective film 4. The circumferential or peripheral area surrounds a central area of the front surface 4a of the protective film 4.

The base sheet 7 and the cushioning layer 13 have a substantially circular shape. The outer diameters of the base sheet 7 and the cushioning layer 13 are substantially identical to each other and to the outer diameter of the adhesive layer 9.

The base sheet 7 may, for example, have a thickness in the range of 500 to 1000 µm. The protective film 4 may have a thickness in the range of 5 to 200 µm. The cushioning layer 13 may have a thickness in the range of 10 to 300 µm, preferably 50 to 200 µm.

The cushioning layer 13 is curable by an external stimulus, such as UV radiation, heat, an electric field and/or a chemical agent. In particular, the cushioning layer 13 may be formed of a curable resin, such as ResiFlat by DISCO Corporation or TEMPLOC by DENKA.

The protective sheeting 5 is formed by laminating the protective film 4 and the base sheet 7 having the cushioning layer 13 applied to the front surface 17 thereof.

Figure 4:
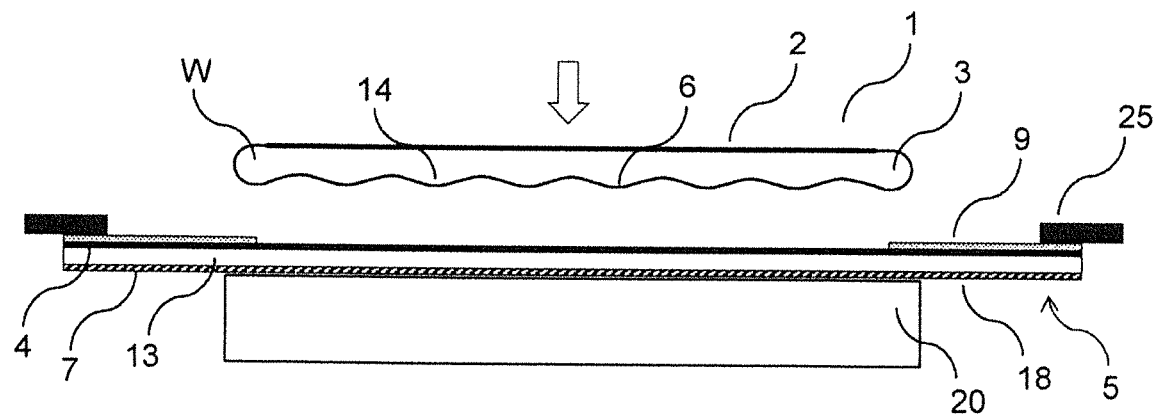
FIG. 4 is a cross-sectional view illustrating a step of applying the protective sheeting shown in FIG. 3 to the wafer shown in FIG. 1 in a method of processing the wafer according to an embodiment of the present invention.

FIG. 4 illustrates a step of applying the front surface 4*a* of the protective film 4 to the back side 6 of the wafer W.

As is shown in FIG. 4, the annular adhesive layer 9 has an outer diameter which is larger than the inner diameter of an annular frame 25. Further, the annular adhesive layer 9 has an inner diameter which is smaller than the outer diameter of the wafer W but larger than the outer diameter of the device area 2. Hence, it can be reliably ensured that the adhesive of the adhesive layer 9 comes into contact only with the peripheral portion of the back side 6 of the wafer W, which corresponds to the peripheral marginal area 3 on the front side 1 of the wafer W.

Figure 6:
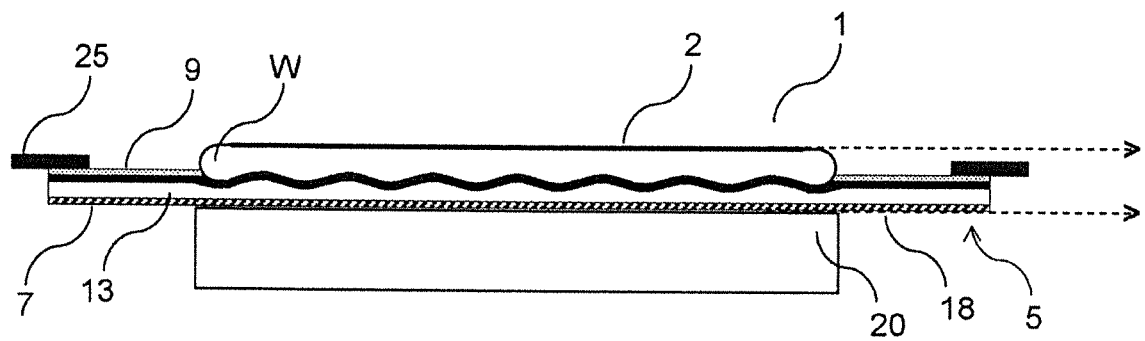
FIG. 6 is a cross-sectional view showing the outcome of a step of attaching the protective sheeting to the wafer.

Before applying the protective sheeting 5 to the wafer W, a peripheral portion of the protective sheeting 5 is mounted on the annular frame 25. Further, a back surface 18 of the base sheet 7 opposite to the front surface 17 thereof is placed on a chuck table 20. Subsequently, as is indicated by an arrow in FIG. 4, the wafer W is applied to the protective sheeting 5 placed on the chuck table 20, thereby applying the front surface 4*a* of the protective film 4 to the back side 6 of the wafer W and adhering the protective film 4 to the peripheral portion of the back side 6 by the adhesive layer 9. Further, the protrusions 14 protruding on the back side 6 of the wafer W are embedded in the cushioning layer 13, as is schematically shown in FIG. 6.

The protective film 4 covers the protrusions 14, thus protecting them against damage or contamination. Further, the protective film 4 acts as an additional cushion or buffer in a subsequent cutting step, as will be detailed below.

The adhesive forming the adhesive layer 9 may be curable by an external stimulus, such as heat, UV radiation, an electric field and/or a chemical agent. In this way, the protective sheeting 5 can be particularly easily removed from the wafer W after processing.

In particular, the adhesive may be an acrylic resin or an epoxy resin. A preferred example of a UV curable-type resin for the adhesive is, e.g., urethane acrylate oligomer.

Further, the adhesive may be, for example, a water soluble resin.

The protective film 4 is made of a polyolefin. For example, the protective film 4 may be made of polyethylene (PE) or polypropylene (PP).

The protective film 4 is pliable and extendable to approximately three times its original diameter.

When applying the wafer W to the protective sheeting 5, the protective film 4 is expanded, e.g., to approximately three times its original diameter, so as to closely follow the contours of the protrusions 14, as is schematically shown in FIG. 6.

The back surface 18 of the base sheet 7 is substantially parallel to the front side 1 of the wafer W, as is indicated by dashed arrows in FIG. 6.

The protective sheeting 5 is applied to the back side 6 of the wafer W so that the central area of the front surface 4*a* of the protective film 4, i.e., the area of the front surface 4*a* inside the annular adhesive layer 9, is in direct contact with the back side 6 of the wafer W (see FIGS. 4 and 6). Thus, no material, in particular, no adhesive, is present between the central area of the front surface 4*a* of the protective film 4 and the back side 6 of the wafer W.

After applying the protective sheeting 5 to the back side 6 of the wafer W, an external stimulus is applied to the protective film 4 so that the protective film 4, and thus the protective sheeting 5, is attached, i.e., fully attached, to the back side 6 of the wafer W.

Applying the external stimulus to the protective film 4 may comprise or consist of heating the protective film 4 and/or cooling the protective film 4 and/or applying a vacuum to the protective film 4 and/or irradiating the protective film 4 with radiation, such as light, e.g., by using a laser beam.

The external stimulus may comprise or be a chemical compound and/or electron or plasma irradiation and/or mechanical treatment, such as pressure, friction or ultrasound application, and/or static electricity.

Particularly preferably, applying the external stimulus to the protective film 4 comprises or consists of heating the protective film 4. For example, applying the external stimulus to the protective film 4 may comprise or consist of heating the protective film 4 and applying a vacuum to the protective film 4. In this case, the vacuum may be applied to the protective film 4 during and/or before and/or after heating the protective film 4.

In particular, the protective film 4 may be heated by heating the chuck table 20 (see FIGS. 4 to 6), e.g., to a temperature in the range of 60° C. to 150° C. Particularly preferably, the chuck table 20 is heated to a temperature of approximately 80° C. The chuck table 20 may be heated, for example, over a duration in the range of 1 min to 10 min.

Further, pressure may be applied to the protective sheeting 5 and/or the wafer W so as to press the protective film 4 against the back side 6 of the wafer W. For this purpose, a pressure application means (not shown), such as a roller, e.g., a heated roller, may be used. In addition to heating the protective film 4 through the heated chuck table 20, or as an alternative thereto, heat may be applied to the protective film 4 by such a heated roller.

By heating the protective film 4, using the heated chuck table 20 and/or the heated roller, the protective film 4 is attached, i.e., fully attached, to the back side 6 of the wafer W.

Specifically, an attachment force between the central area of the front surface 4*a* of the protective film 4 and the back side 6 of the wafer W is generated through the heating process. In particular, by heating the protective film 4, a form fit and/or a material bond is formed between protective film 4 and wafer W in this central area.

Further, the peripheral area of the front surface 4*a* of the protective film 4 is adhered to the peripheral portion of the back side 6 of the wafer W by the adhesive layer 9, thus ensuring a particularly robust and reliable attachment of the protective sheeting 5.

In the attached state of the protective sheeting 5, which is shown in FIG. 6, the protrusions 14 protruding from the plane back side surface of the wafer W are fully embedded in the protective sheeting 5.

Figure 7:
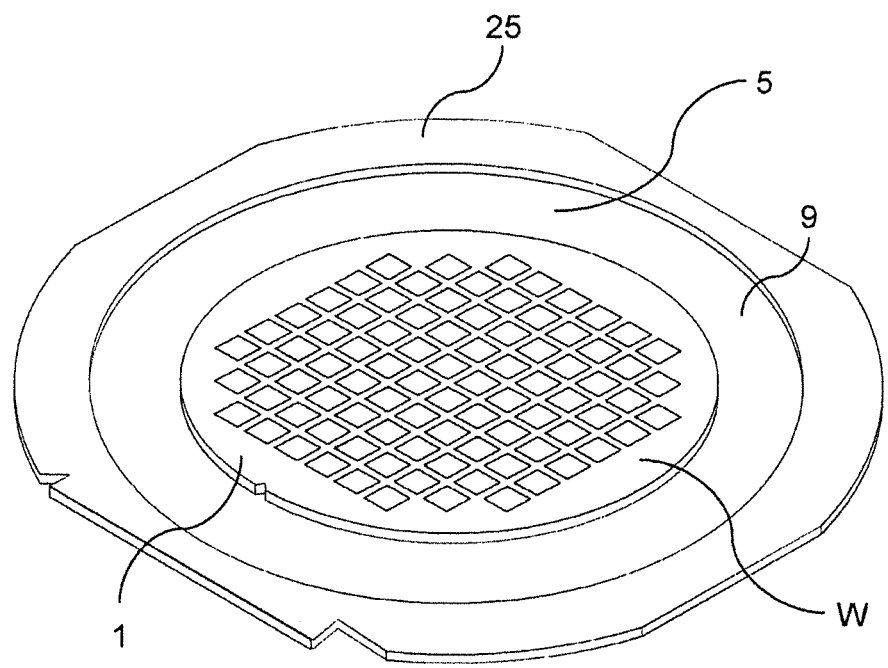
FIG. 7 is a perspective view of the arrangement of the wafer and the protective sheeting shown in FIG. 6.

By attaching the protective sheeting 5 to the wafer W in the manner described above, a wafer unit consisting of the wafer W, the protective film 4, the cushioning layer 13 and the base sheet 7 is formed, as is shown in FIGS. 6 and 7.

Figure 5:
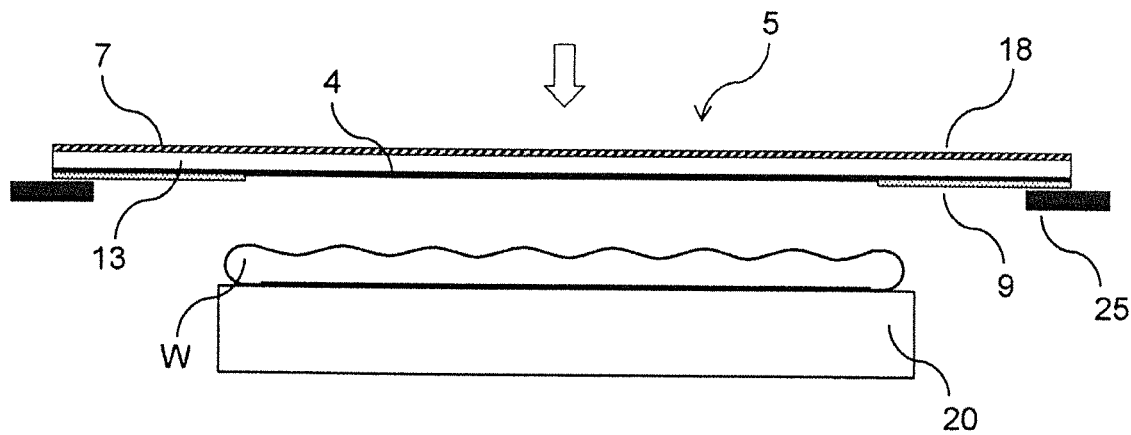
FIG. 5 is a cross-sectional view illustrating a step of applying the protective sheeting shown in FIG. 3 to the wafer shown in FIG. 1 in a method of processing the wafer according to another embodiment of the present invention.

An alternative approach of attaching the protective sheeting 5 to the wafer W is illustrated in FIG. 5.

Specifically, as is shown in this drawing, the front side 1 of the wafer W may be placed on the chuck table 20 so that the back side 6 is oriented upwards. Subsequently, the protective sheeting 5 may be applied and attached to the back side 6 of the wafer W held on the chuck table 20, as is indicated by an arrow in FIG. 5, so that the protrusions 14 are embedded in the cushioning layer 13 and the back surface 18 of the base sheet 7 is substantially parallel to the front side 1 of the wafer W. This alternative step of attaching the wafer W and the protective sheeting 5 to each other can be carried out, for example, in a vacuum mounter, such as a vacuum chamber, e.g., the vacuum chamber described above.

After attaching the wafer W and the protective sheeting 5 to each other, another external stimulus is applied to the cushioning layer 13 so as to cure the cushioning layer 13. For example, for the case of a heat curable, e.g., thermosetting, cushioning layer 13, the cushioning layer 13 may be cured by heating in an oven. For the case of a UV curable cushioning layer 13, the cushioning layer 13 is cured by the application of UV radiation, e.g., through the base sheet 7, if a base sheet material is used which is transparent to this type of radiation, such as PET or glass.

Hence, the protrusions 14 are firmly held in the cured cushioning layer 13 and the substantially parallel relative alignment of the base sheet back surface 18 and the pattern side 1 is particularly reliably maintained throughout the further processing.

It is to be noted, however, that the step of curing the cushioning layer 13 described above is optional. Alternatively, the cushioning layer 13 may be formed of a non-curable material, such as a non-curable adhesive, a non-curable resin or a non-curable gel, or the cushioning layer 13 may be formed of a curable material but not be cured in the method of processing the wafer W.

Subsequently, after the optional step of curing the cushioning layer 13, the front side 1 of the wafer W is processed in the state, in which the back surface 18 of the base sheet 7, which is a plane, flat surface, is placed on the top surface of the chuck table 20 (see FIG. 6). In particular, the processing step may comprise or consist of a step of cutting the front side 1 of the wafer W, e.g., cutting the wafer W along the division lines 11. In this way, the wafer W can be divided into individual chips or dies, each chip or die having a respective device 27 (see FIG. 2).

Figure 8:
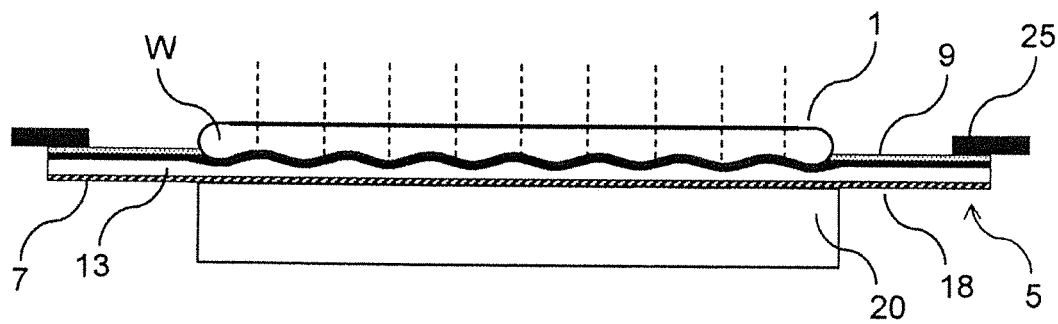
FIG. 8 is a cross-sectional view illustrating a cutting step performed on the wafer shown in FIGS. 6 and 7.

The step of cutting the wafer W along the division lines 11 is indicated by dashed lines in FIG. 8. As is illustrated in this drawing, in the present embodiment, the wafer W is cut from the front side 1 thereof. The cutting of the wafer W may be performed by mechanical cutting, e.g., by blade dicing or sawing, and/or by laser cutting and/or by plasma cutting. For example, laser cutting may be carried out by laser ablation or by forming modified layers inside the wafer W along the division lines 11 by laser irradiation. The wafer W may be cut in a single mechanical cutting step, a single laser cutting step or a single plasma cutting step.

Alternatively, the wafer W may be cut by a sequence of mechanical cutting and/or laser cutting and/or plasma cutting steps. Moreover, the cutting process may be carried out using a sequence of cutting steps with different cutting widths.

Since the plane back surface 18 of the base sheet 7, which is placed on the top surface of the chuck table 20 that may form part of a cutting apparatus (not shown), is substantially parallel to the front side 1 of the wafer W, the pressure applied to the wafer W, e.g., by a cutting blade or saw, during the cutting process is evenly and homogenously distributed over the wafer W. Hence, any risk of breakage of the wafer W can be minimised. Further, the substantially parallel alignment of the flat, even back surface 18 of the base sheet 7 and the front side 1 of the wafer W allows for the cutting step to be carried out with a high degree of precision, thus achieving particularly well-defined and uniform shapes and sizes of the resulting chips or dies.

The protective film 4 covers the protrusions 14 formed on the back side 6 of the wafer W, therefore protecting the protrusions 14 from damage and contamination, e.g., by residues of the material forming the cushioning layer 13. Moreover, the protective film 4 functions as an additional cushion or buffer between the back side 6 of the wafer W and the cushioning layer 13, thus further contributing to the uniform and homogeneous distribution of pressure during processing, such as cutting. Therefore, breakage of the wafer W during the cutting process can be particularly reliably prevented.

After the chips or dies have been completely divided from one another in the cutting step, they may be picked up by a pick-up device (not shown).

Before carrying out this pick-up step, the base sheet 7 and the cushioning layer 13 may be removed from the divided wafer W together, so that the chips or dies remain on the protective film 4. In this way, the separated dies or chips can be picked up from the protective film 4 in a particularly simple and efficient manner. For example, the protective film 4 may be radially expanded, using an expansion drum or the like, thereby increasing a gap between adjacent chips or dies and thus facilitating the pick-up process. Since the protective film 4 is attached to the back side 6 of the wafer W in the central area and the peripheral area of the front surface 4a of the protective film 4, by the application of the external stimulus and by the adhesive layer 9, respectively, this process of separating the chips or dies from each other can be carried out in a particularly reliable and efficient manner.

The cushioning layer 13 may exhibit a degree of compressibility, elasticity and/or flexibility, e.g., a rubber-like behavior, after curing, thus allowing for a particularly easy removal thereof from the wafer W. Alternatively or additionally, another external stimulus, such as hot water, may be applied to the cured cushioning layer 13 prior to removal thereof, in order to soften the cured cushioning layer 13 for further facilitating the removal process.

The protective film 4 is arranged on the back side 6 of the wafer W so that the adhesive of the adhesive layer 9 is in contact only with the peripheral portion of the back side 6, which corresponds to the peripheral marginal area 3 on the front side 1 of the wafer W. No material, in particular, no adhesive, is present between the central area of the front surface 4a of the protective film 4 and the wafer back side 6, i.e., between the protective film 4 and the separated chips or dies. Hence, the risk of a possible contamination of or damage to the chips or dies, e.g., due to the adhesive force of the adhesive layer 9 or adhesive residues on the chips or dies, in the pick-up process is eliminated.

In the following, a method of processing a wafer W according to another embodiment of the present invention will be described with reference to FIGS. 9 to 12.

The method according to the embodiment of FIGS. 9 to 12 differs from the method according to the embodiment of FIGS. 1 to 8 mainly in that only a protective film 4, rather than a protective sheeting 5, is used and in that no adhesive is provided on the front surface 4a of the protective film 4 in the entire area where the front surface 4a and the wafer back side 6 are in contact with each other. Further, no protrusions or projections are present on the back side 6 of the wafer W. In the description of the present embodiment, the elements which are similar or substantially identical to those of the embodiment of FIGS. 1 to 8 are denoted by the same reference signs and a repeated detailed description thereof is omitted.

Figure 9:
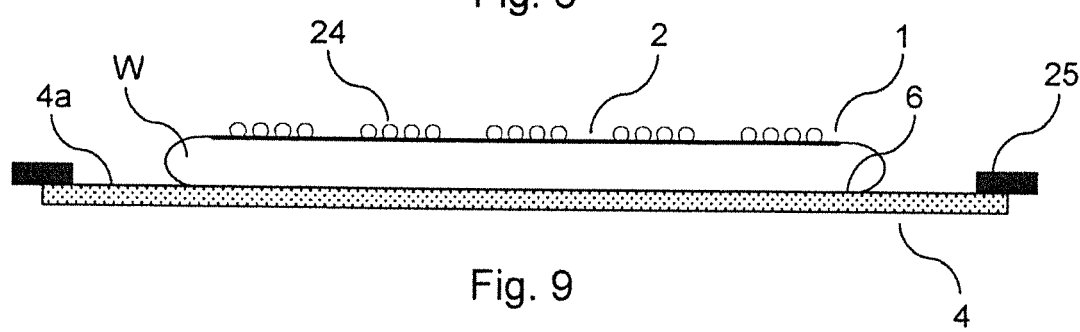
FIG. 9 is a cross-sectional view showing the outcome of a step of attaching a protective film to a wafer in a method of processing the wafer according to another embodiment of the present invention.

The device area 2 of the wafer W shown in FIG. 9 is formed with a plurality of protrusions 24 protruding from a plane surface of the wafer W. The protrusions 24 may be, for example, bumps for establishing an electrical contact with the devices of the device area 2 in the separated chips or dies. The height of the protrusions 24 in the thickness direction of the wafer W may be in the range of 20 to 500 μm.

Before applying the protective film 4 to the wafer W, a peripheral portion of the protective film 4 is mounted on the annular frame 25 (see FIG. 5). Subsequently, the protective film 4 is applied to the back side 6 of the wafer W so that, in the entire region where the front surface 4a of the protective film 4 is in contact with the wafer back side 6, the front surface 4a of the protective film 4 is in direct contact with the back side 6. Thus, no material, in particular, no adhesive, is present between the front surface 4a and the back side 6.

After applying the protective film 4 to the back side 6 of the wafer W, an external stimulus is applied to the protective film 4 so that the protective film 4 is attached to the back side 6 of the wafer W. The application of the external stimulus to the protective film 4 may be performed substantially in the same manner as detailed above for the embodiment of FIGS. 1 to 8, in particular, by heating the protective film 4. The outcome of this attachment step is shown in FIG. 9.

Figure 10:
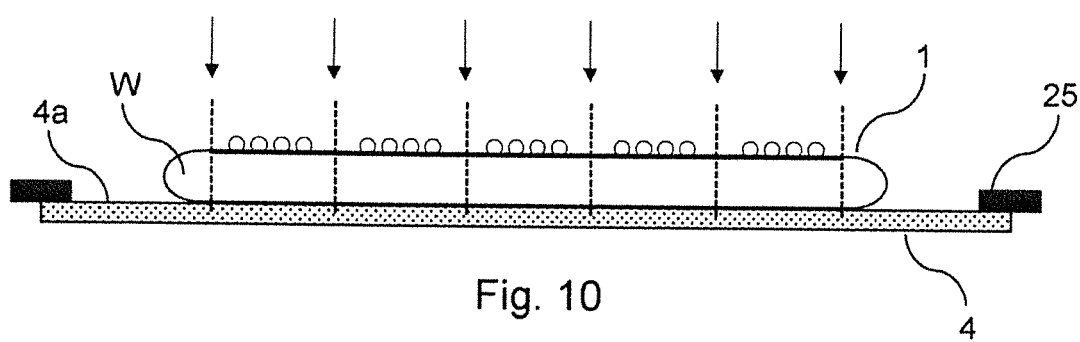
FIG. 10 is a cross-sectional view illustrating a cutting step performed on the wafer shown in FIG. 9.

Subsequently, the wafer W is processed, i.e., cut along the division lines 11 (see FIG. 2), from the front side 1 thereof, as is indicated by arrows and dashed lines in FIG. 10. The cutting step may be performed substantially in the same manner as detailed above for the embodiment of FIGS. 1 to 8.

Figure 11:
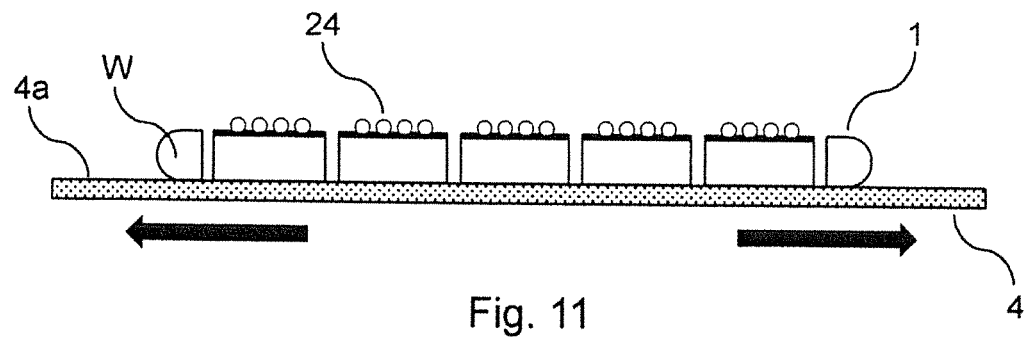
FIG. 11 is a cross-sectional view illustrating a device separating step performed after the cutting step shown in FIG. 10.

In this cutting process, the wafer W may be fully divided into individual chips or dies, e.g., by a mechanical cutting process, a laser cutting process or a plasma cutting process. Subsequently, the fully divided chips or dies may be moved away from each other by radially expanding the protective film 4, for example, using an expansion drum or the like, thereby increasing the distances between adjacent chips or dies, as is shown in FIG. 11. In this way, a following step of picking up the chips or dies, e.g., by a pick-up device (not shown), is significantly facilitated.

Moving the chips or dies away from each other by radially expanding the protective film 4 allows for the chips or dies to be separated in an especially efficient manner. In particular, no remounting of the wafer W, e.g., onto a separate adhesive tape, such as an expansion tape, is necessary, so that the number of process steps is reduced.

Alternatively, in order to obtain individual chips or dies, the wafer W may be subjected to a stealth dicing process, i.e., a process in which modified regions are formed within the wafer W by the application of a laser beam, as has been detailed above. The laser beam is applied to the wafer W from the front side 1 thereof. Subsequently, the wafer W may be divided, e.g., broken, along the division lines 11 where the modified regions are formed by radially expanding the protective film 4, as is indicated by two arrows in FIG. 11.

No material, in particular, no adhesive, is present between the front surface 4a of the protective film 4 and the wafer back side 6, i.e., between the protective film 4 and the separated chips or dies. Hence, the risk of a possible contamination of or damage to the chips or dies, e.g., due to the adhesive force of an adhesive layer or adhesive residues on the chips or dies, in the pick-up process is eliminated.

Figure 12:
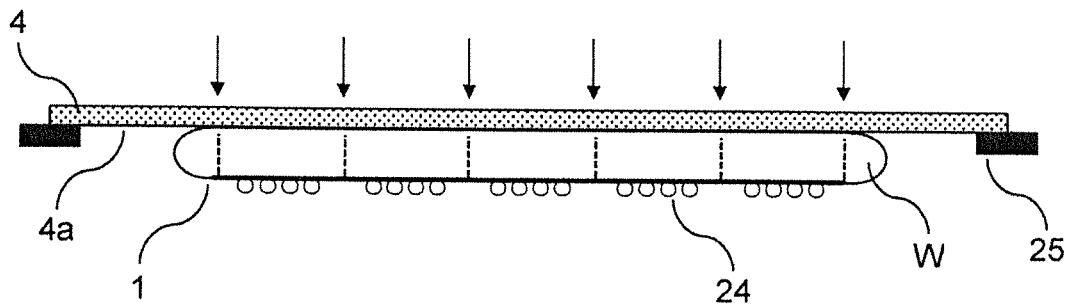
FIG. 12 is a cross-sectional view illustrating a stealth dicing step performed on the wafer shown in FIG. 9.

An alternative way of dividing the wafer W is illustrated in FIG. 12. In this approach, rather than performing a cutting or stealth dicing process from the front side 1 of the wafer W, the wafer W is subjected to stealth dicing from the back side 6 thereof. In particular, a pulsed laser beam is applied to the wafer W from its back side 6, as is indicated by arrows in FIG. 12. The protective film 4 is made of a material which is transparent to the pulsed laser beam. Hence, the laser beam is transmitted through the protective film 4 and forms a plurality of modified regions (indicated by dashed lines in FIG. 12) in the wafer W along the division lines 11. After forming these modified regions in the wafer W, the wafer W may be divided, e.g., broken, along the division lines 11 by radially expanding the protective film 4 (see FIG. 11).

Performing stealth dicing from the back side 6 of the wafer W is particularly advantageous if elements, such as metal structures or the like, are provided on the wafer front side 1 which affect or even block transmission of the pulsed laser beam.

In the following, a method of processing a wafer W according to another embodiment of the present invention will be described with reference to FIGS. 13 to 18.

Figure 13:
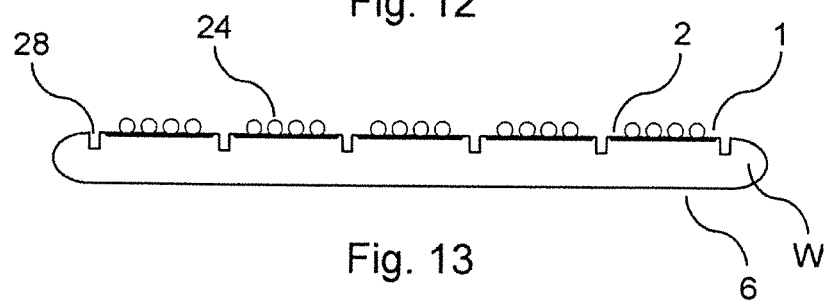
FIG. 13 is a cross-sectional view showing the outcome of a step of removing wafer material in a method of processing the wafer according to another embodiment of the present invention.

In the description of the present embodiment, the elements which are similar or substantially identical to those of the previous embodiments are denoted by the same reference signs and a repeated detailed description thereof is omitted. In particular, the wafer W shown in FIG. 13 is substantially identical to that shown in FIG. 9.

In the method of this embodiment, wafer material is removed along the division lines 11 (see FIGS. 15A and 15B) from the front side 1 of the wafer W. In this process, wafer material is removed along only a part of the thickness of the wafer W so as to form grooves 28 extending along the division lines 11, as is shown in FIGS. 13, 15A and 15B.

The wafer material may be removed along the division lines 11 in the same manner as detailed above. In particular, the wafer material may be mechanically removed along the division lines 11. For example, the wafer material may be removed along the division lines 11 by mechanically cutting the wafer W along the division lines 11, e.g., by blade dicing or sawing. Alternatively or in addition, the wafer material may be removed along the division lines 11 by laser cutting and/or by plasma cutting.

Figures 15A, 15B:
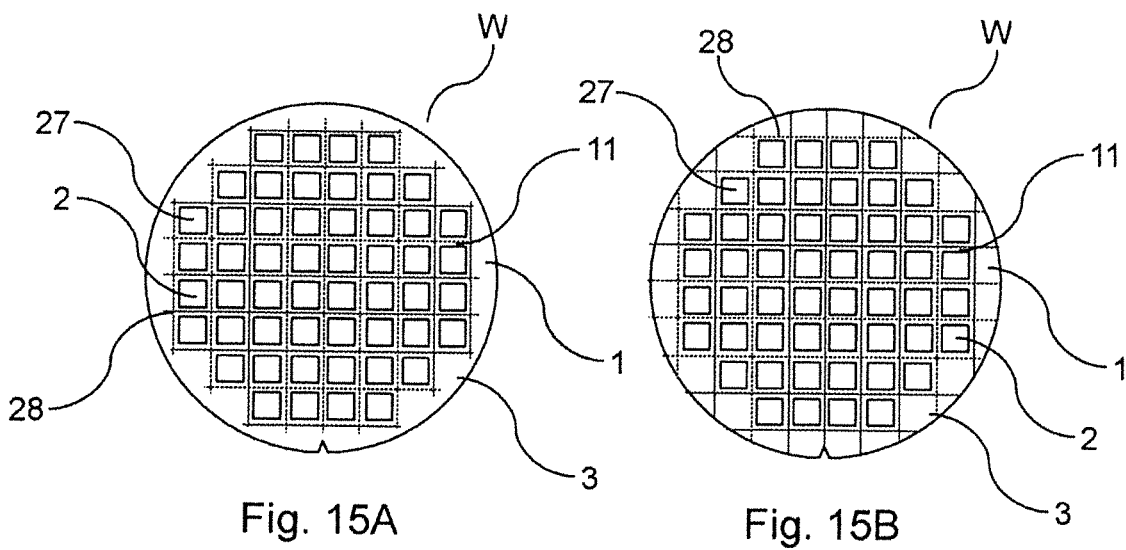
FIG. 15A is a top view of the wafer shown in FIG. 13.
FIG. 15B is a top view of the wafer showing the outcome of a modified step of removing wafer material.

As is shown in FIG. 15A, the process of removing wafer material along the division lines 11 may be performed so that the grooves 28 do not extend all the way to lateral edges of the wafer W. In this case, no wafer material is removed in a peripheral portion of the wafer W. In this way, the device area 2 can be particularly reliably protected against contamination. In particular, the protective film 4 can be attached to the peripheral portion of the wafer W in especially close contact to the wafer surface, thus efficiently sealing the device area 2.

Alternatively, as is shown in FIG. 15B, the process of removing wafer material along the division lines 11 may be performed so that the grooves 28 extend all the way to the lateral edges of the wafer W.

Figure 14:
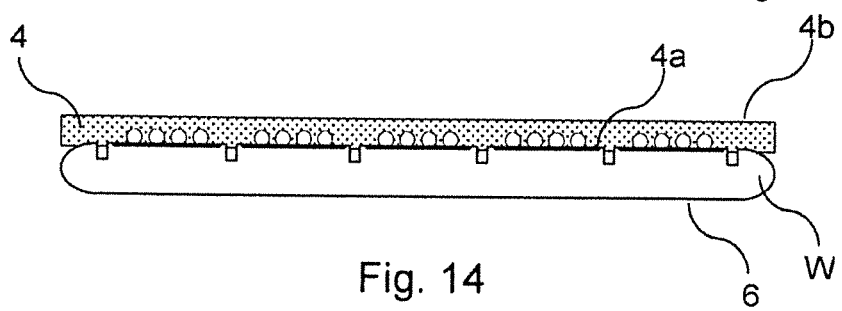
FIG. 14 is a cross-sectional view showing the outcome of a step of attaching a protective film to the wafer shown in FIG. 13.

After removing the wafer material along the division lines 11, the protective film 4, for covering the devices 27 on the wafer W, is applied to the front side 1 of the wafer W so that, in the entire region where the front surface 4a of the protective film 4 is in contact with the wafer front side 1, the front surface 4a of the protective film 4 is in direct contact with the front side 1. Thus, no material, in particular, no adhesive, is present between the front surface 4a of the protective film 4 and the wafer front side 1. The protective film 4 preferably has the same shape as the wafer W, i.e., a circular shape in the present embodiment, and is concentrically attached thereto. The diameter of the protective film 4 is approximately the same as that of the wafer W, as is schematically shown in FIG. 14.

After applying the protective film 4 to the front side 1 of the wafer W, an external stimulus is applied to the protective film 4 so that the protective film 4 is attached to the front side 1. The application of the external stimulus to the protective film 4 may be performed substantially in the same manner as detailed above for the embodiment of FIGS. 1 to 8, in particular, by heating the protective film 4. The outcome of this attachment step is shown in FIG. 14. In the attached state of the protective film 4, the protrusions 24 protruding from the plane surface of the wafer front side 1 are fully embedded in the protective film 4.

Figure 16:
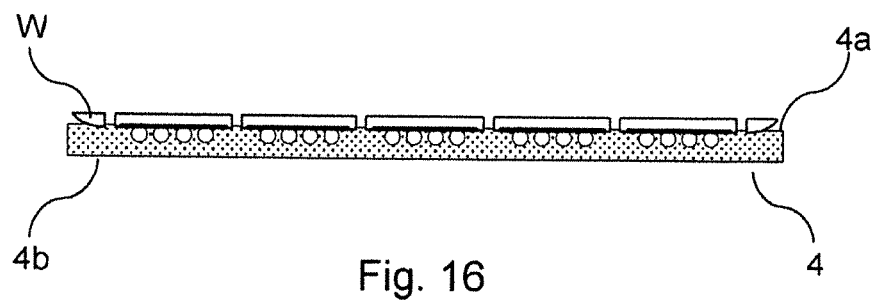
FIG. 16 is a cross-sectional view showing the outcome of a step of grinding the back side of the wafer shown in FIG. 14.

Subsequently, the back side 6 of the wafer W is ground to adjust the wafer thickness. Grinding the wafer back side 6 is performed along a remaining part of the thickness of the wafer W in which no wafer material has been removed, so as to divide the wafer W along the division lines 11, thereby obtaining individual chips or dies. The outcome of this grinding step is shown in FIG. 16. After grinding the back side 6 of the wafer W, the back side 6 may be polished and/or etched, e.g., plasma etched.

Figure 17:
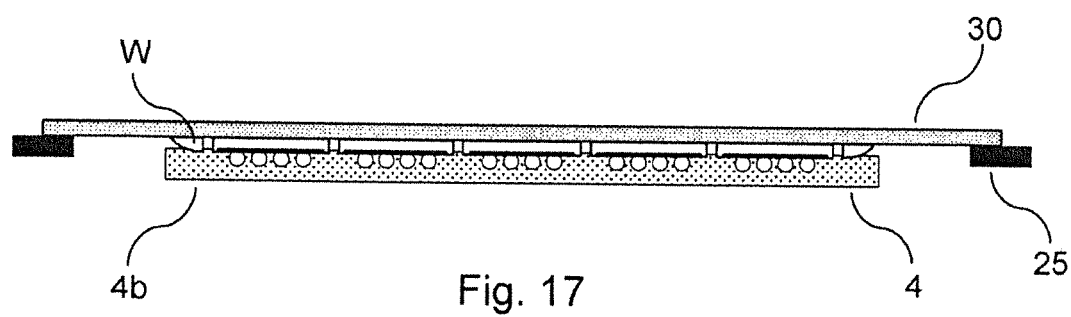
FIG. 17 is a cross-sectional view showing the outcome of a step of attaching an adhesive tape to the wafer shown in FIG. 16.
Figure 18:
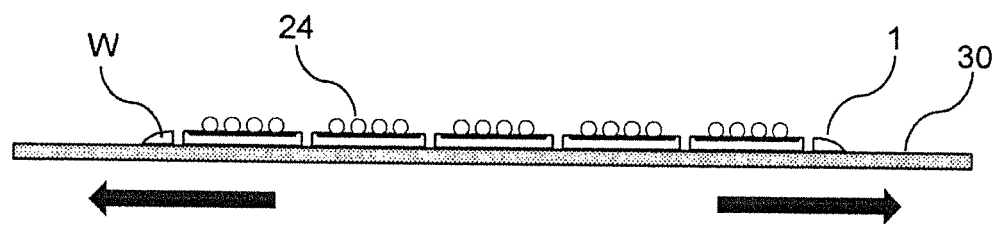
FIG. 18 is a cross-sectional view illustrating a device separating step performed after the attachment step shown in FIG. 17.

In a following step, an expandable adhesive tape 30, such as an expansion tape, is attached to the ground back side 6 of the wafer W. A peripheral portion of the adhesive tape 30 is mounted on an annular frame 25. The outcome of this attachment step is shown in FIG. 17.

After the adhesive tape 30 has been attached to the ground wafer back side 6, the protective film 4 is removed. The adhesive tape 30 is then radially expanded, e.g., by using an expansion drum or the like, as is indicated by two arrows in FIG. 18, so as to move the divided chips or dies away from each other, thereby increasing the distances between adjacent chips or dies. Subsequently, the chips or dies may be picked up, e.g., by using a pick-up device (not shown).

In the following, a method of processing a wafer W according to another embodiment of the present invention will be described with reference to FIGS. 19 to 27.

Figure 19:
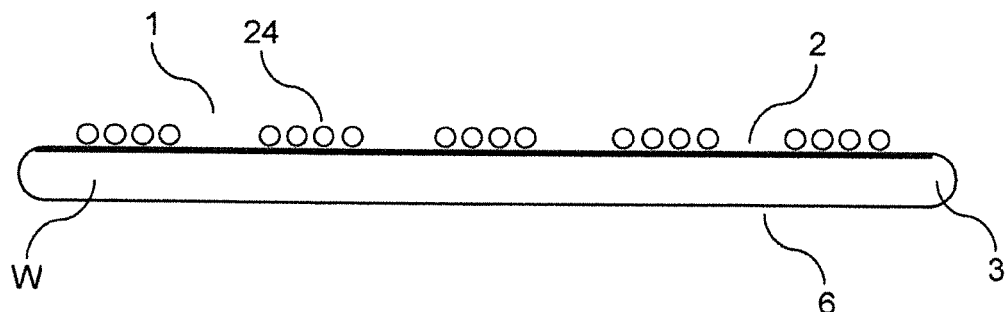
FIG. 19 is a cross-sectional view showing a wafer to be processed by a method of the present invention.
Figure 20:
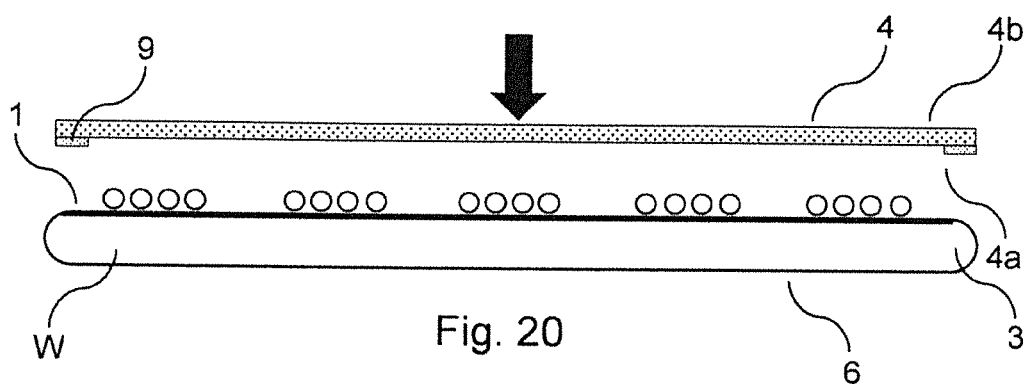
FIG. 20 is a cross-sectional view illustrating a step of applying a protective film to the wafer according to another embodiment of the method of the present invention.

In the description of the present embodiment, the elements which are similar or substantially identical to those of the previous embodiments are denoted by the same reference signs and a repeated detailed description thereof is omitted. In particular, the wafer W shown in FIG. 19 is substantially identical to that shown in FIG. 9.

In the method of this embodiment, a protective film 4 having an adhesive layer 9 is applied, for covering the devices 27 on the wafer W, to the front side 1 of the wafer W (as is indicated by an arrow in FIG. 20), so that a central area of the front surface 4a of the protective film 4 is in direct contact with the front side 1 of the wafer W. Thus, no material, in particular, no adhesive, is present between the central area of the front surface 4a of the protective film 4 and the wafer front side 1.

The adhesive layer 9 has an annular shape and is provided only in a peripheral area of the front surface 4a of the protective film 4. The peripheral area surrounds the central area of the front surface 4a of the protective film 4. The protective film 4 is applied to the wafer front side 1 so that the adhesive of the adhesive layer 9 comes into contact only with a peripheral portion of the front side 1. This peripheral portion of the front side 1 is arranged within the peripheral marginal area 3 in which no devices 27 are formed. In this regard, it is to be noted that the adhesive layer 9 is not shown in FIGS. 22 to 24 for the sake of simpler presentation.

Figure 21:
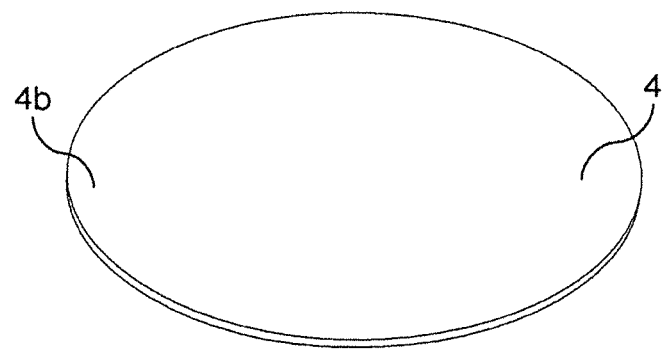
FIG. 21 is a perspective view illustrating the step of applying the protective film to the wafer according to the embodiment shown in FIG. 20.
Figure 21:
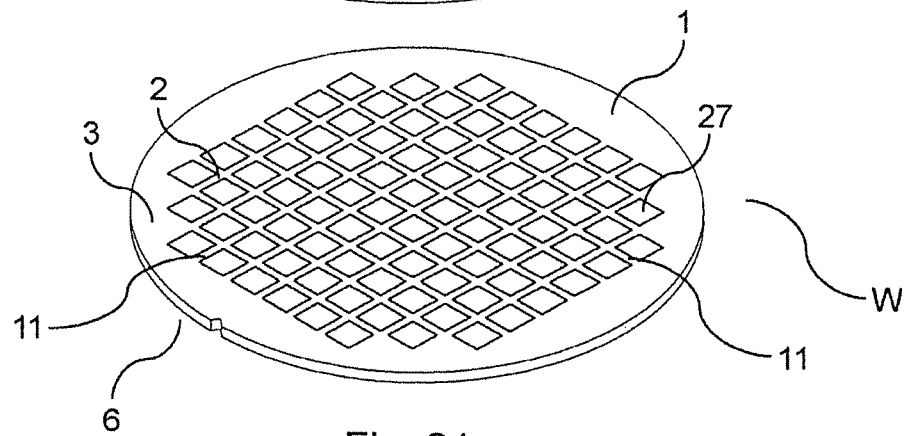
Figure 22:
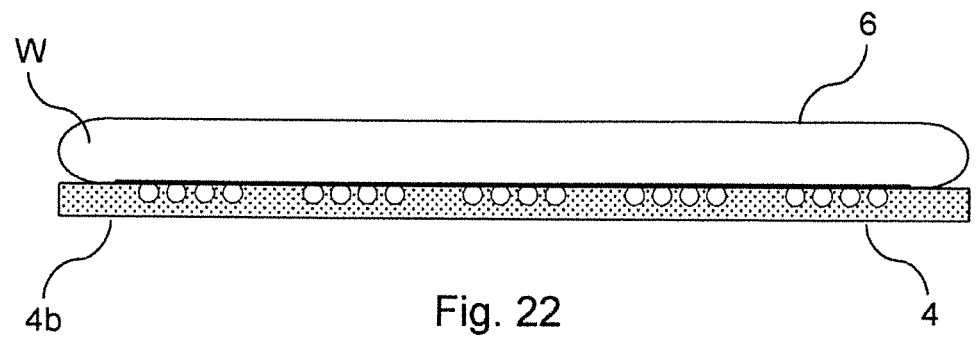
FIG. 22 is a cross-sectional view showing the outcome of a step of attaching the protective film to the wafer.

The protective film 4 preferably has the same shape as the wafer W, i.e., a circular shape in the present embodiment, and is concentrically attached thereto. The diameter of the protective film 4 is approximately the same as that of the wafer W, as is schematically shown in FIGS. 21 and 22.

The protective film 4 covers the devices 27 formed in the device area 2, including the protrusions 24, thus protecting the devices 27 against damage or contamination. Further, the protective film 4 acts as a cushion in subsequent processing of the wafer W, e.g., in a subsequent grinding step.

After applying the protective film 4 to the front side 1 of the wafer W, an external stimulus is applied to the protective film 4 so that the protective film 4 is attached, i.e., fully attached, to the wafer front side 1. The application of the external stimulus to the protective film 4 may be performed substantially in the same manner as detailed above for the embodiment of FIGS. 1 to 8, in particular, by heating the protective film 4. The outcome of this attachment step is shown in FIG. 22. In the attached state of the protective film 4, the protrusions 24 protruding from the plane surface of the wafer front side 1 are fully embedded in the protective film 4.

An attachment force between the central area of the front surface 4a of the protective film 4 and the front side 1 of the wafer W is generated through the application of the external stimulus, e.g., the heating process. In particular, by heating the protective film 4, a form fit and/or a material bond may be formed between protective film 4 and wafer W in this central area.

Further, the peripheral area of the front surface 4a of the protective film 4 is adhered to the peripheral portion of the front side 1 of the wafer W by the adhesive layer 9, thus ensuring a particularly robust and reliable attachment of the protective film 4.

After attaching the protective film 4 to the front side 1 of the wafer W, the back side 6 of the wafer W is processed. The back side 6 of the wafer W may be processed by grinding and/or polishing and/or etching and/or cutting.

Figure 23:
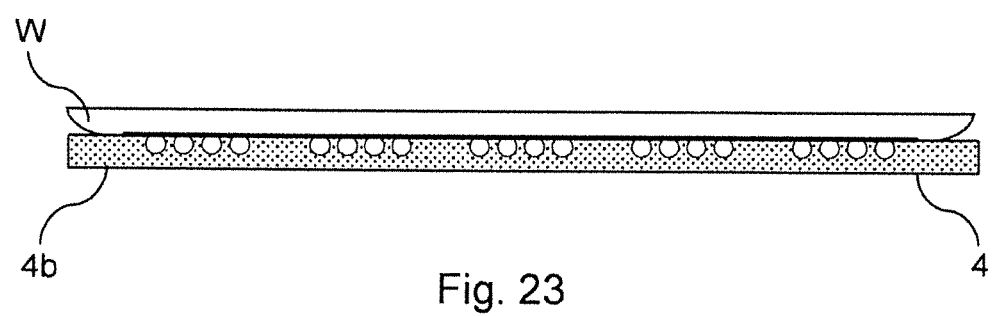
FIG. 23 is a cross-sectional view showing the outcome of a step of grinding the back side of the wafer shown in FIG. 22.

In the method of the present embodiment, the wafer back side 6 is ground to adjust the wafer thickness after attaching the protective film 4 to the wafer front side 1. The outcome of this grinding step is shown in FIG. 23. After grinding the back side 6 of the wafer W, the back side 6 may be polished and/or etched, e.g., plasma etched.

Figure 24:
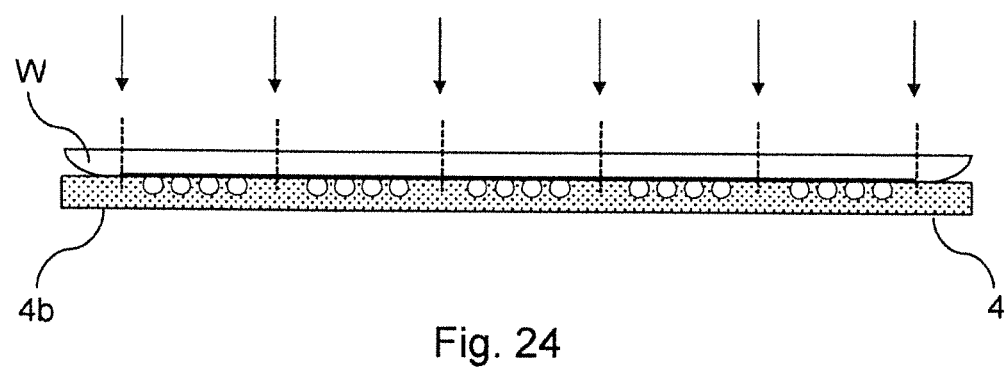
FIG. 24 is a cross-sectional view illustrating a cutting step performed on the wafer shown in FIG. 23.
Figure 25:
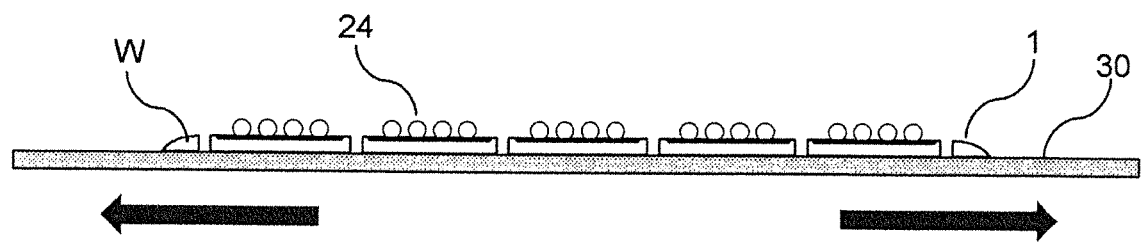
FIG. 25 is a cross-sectional view illustrating a device separating step performed after the cutting step shown in FIG. 24.

Subsequently, the ground wafer back side 6 is further processed, i.e., cut along the division lines 11 (see FIG. 21), as is indicated by arrows and dashed lines in FIG. 24. The cutting step may be performed substantially in the same manner as detailed above for the embodiment of FIGS. 1 to 8.

In this cutting process, the wafer W may be fully divided into individual chips or dies, e.g., by a mechanical cutting process, a laser cutting process or a plasma cutting process. Subsequently, an expandable adhesive tape 30, such as an expansion tape, may be attached to the ground back side 6 of the wafer W (see FIG. 25).

After the adhesive tape 30 has been attached to the ground wafer back side 6, the protective film 4 may be removed. The adhesive tape 30 may then be radially expanded, e.g., by using an expansion drum or the like, as is indicated by two arrows in FIG. 25, so as to move the divided chips or dies away from each other, thereby increasing the distances between adjacent chips or dies. Subsequently, the chips or dies may be picked up, e.g., by using a pick-up device (not shown).

Alternatively, in order to obtain individual chips or dies, the wafer W may be subjected to a stealth dicing process from the ground back side 6 thereof. Subsequently, the adhesive tape 30 may be attached to the ground back side 6 of the wafer W, the protective film 4 may be removed, and the wafer W may be divided, e.g., broken, along the division lines 11 where the modified regions are formed by radially expanding the adhesive tape 30 (see FIG. 25).

Figure 26:
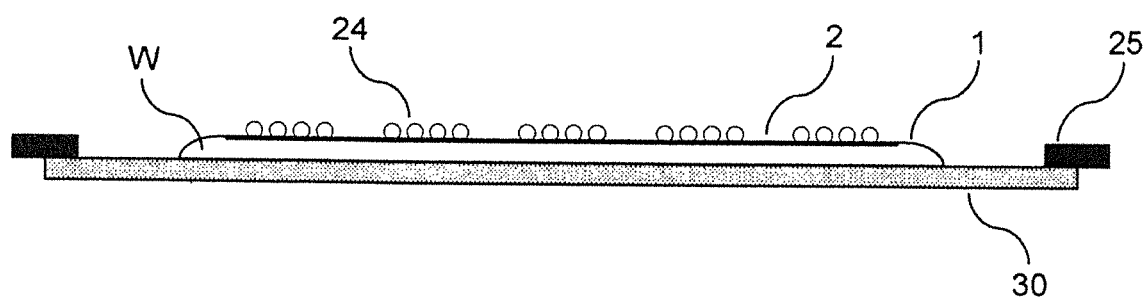
FIG. 26 is a cross-sectional view showing the outcome of a step of attaching an adhesive tape to the wafer shown in FIG. 23.
Figure 27:
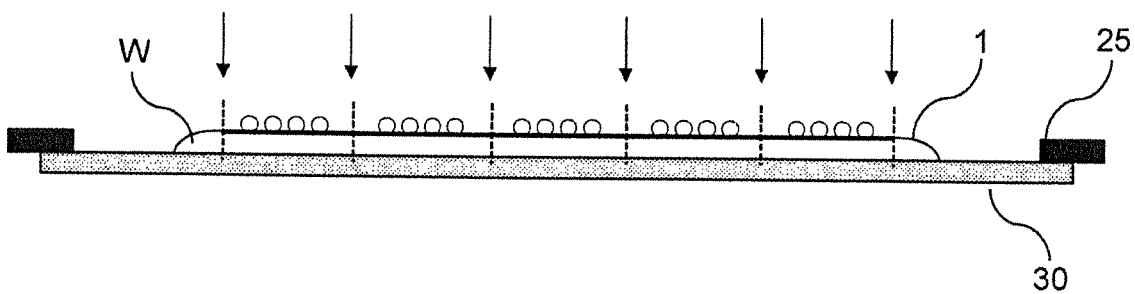
FIG. 27 is a cross-sectional view illustrating a cutting step performed on the wafer shown in FIG. 26.

An alternative way of dividing the wafer W is illustrated in FIGS. 26 and 27. In this approach, after grinding the back side 6 of the wafer W, the adhesive tape 30 is attached to the ground wafer back side 6 and the protective film 4 is removed. The peripheral portion of the adhesive tape 30 is mounted to the annular frame 25. The outcome of these attachment and removal steps is shown in FIG. 26. Subsequently, the wafer W is subjected to cutting or stealth dicing along the division lines 11 from the front side 1 thereof, as is indicated by arrows and dashed lines in FIG. 27.

The invention claimed is:

1. A method of processing a wafer, having on one side a device area with a plurality of devices, wherein the method comprises:
   providing a protective film;
   applying the protective film to a side of the wafer being opposite to the one side, so that at least a central area of a front surface of the protective film is in direct contact with the side of the wafer being opposite to the one side such that no adhesive is present between at least the central area of the front surface of the protective film and the side of the wafer being opposite to the one side, and no adhesive is in direct contact with at least a central area of a surface of the side of the wafer being opposite to the one side;
   applying an external stimulus to the protective film during and/or after applying the protective film to the side of the wafer being opposite to the one side, so that the protective film is attached to the side of the wafer being opposite to the one side;
   processing the one side of the wafer and/or the side of the wafer being opposite to the one side; and
   removing the entire protective film from the wafer after processing the one side of the wafer and/or the side of the wafer being opposite to the one side,
   wherein applying the external stimulus to the protective film comprises heating the protective film.

2. The method according to claim 1, wherein
   at least one division line is formed on the one side of the wafer,
   the method comprises processing the one side of the wafer, and
   processing the one side of the wafer comprises removing wafer material along the at least one division line, preferably along only part of the thickness of the wafer or throughout the entire thickness of the wafer.

3. The method according to claim 2, wherein the wafer material is mechanically removed along the at least one division line, in particular, by mechanically cutting the wafer along the at least one division line.

4. The method according to claim 1, wherein
   at least one division line is formed on the one side of the wafer,
   the method comprises processing the one side of the wafer, and
   processing the one side of the wafer comprises applying a pulsed laser beam to the wafer from the one side of the wafer, wherein the wafer is made of a material which is transparent to the pulsed laser beam and the pulsed laser beam is applied to the wafer at least in a plurality of positions along the at least one division line, in a condition where a focal point of the pulsed laser beam is located at a distance from the one side of the wafer in the direction from the one side of the wafer towards the side of the wafer being opposite to the one side, so as to form a plurality of modified regions in the wafer along the at least one division line.

5. The method according to claim 1, wherein
   at least one division line is formed on the one side of the wafer,
   the method comprises processing the side of the wafer being opposite to the one side, and
   processing the side of the wafer being opposite to the one side comprises applying a pulsed laser beam to the wafer from the side of the wafer being opposite to the one side, wherein the protective film is made of a material which is transparent to the pulsed laser beam, the wafer is made of a material which is transparent to the pulsed laser beam, and the pulsed laser beam is applied to the wafer at least in a plurality of positions along the at least one division line, in a condition where a focal point of the pulsed laser beam is located at a distance from the side of the wafer being opposite to the one side in a direction from the side of the wafer being opposite to the one side towards the one side of the wafer, so as to form a plurality of modified regions in the wafer along the at least one division line.

6. The method according to claim 1, wherein
   the protective film is provided with an adhesive layer,
   the adhesive layer is provided only in a peripheral area of the front surface of the protective film, the peripheral area surrounding the central area of the front surface of the protective film, and
   the protective film is applied to the side of the wafer being opposite to the one side so that the adhesive layer comes into contact only with a peripheral portion of the side of the wafer being opposite to the one side.

7. The method according to claim 6, wherein the adhesive layer has a substantially annular shape, an open rectangular shape or an open square shape.

8. The method according to claim 1, wherein
   the protective film is expandable, and
   the method further comprises, after processing the one side of the wafer and/or the side of the wafer being opposite to the one side, radially expanding the protective film so as to separate the devices from each other.

9. The method according to claim 1, wherein applying the external stimulus to the protective film further comprises cooling the protective film and/or applying a vacuum to the protective film and/or irradiating the protective film with light.

10. The method according to claim 1, wherein the protective film is made of a polymer, in particular, a polyolefin.

* * * * *